(12) United States Patent
Yamazaki et al.

(10) Patent No.: US 7,309,269 B2
(45) Date of Patent: Dec. 18, 2007

(54) METHOD OF FABRICATING LIGHT-EMITTING DEVICE AND APPARATUS FOR MANUFACTURING LIGHT-EMITTING DEVICE

(75) Inventors: Shunpei Yamazaki, Tokyo (JP); Masakazu Murakami, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 222 days.

(21) Appl. No.: 10/410,538

(22) Filed: Apr. 9, 2003

(65) Prior Publication Data
US 2003/0194484 A1 Oct. 16, 2003

(30) Foreign Application Priority Data
Apr. 15, 2002 (JP) .............................. 2002-112590

(51) Int. Cl.
*H01J 9/00* (2006.01)
(52) U.S. Cl. ....................................................... 445/24
(58) Field of Classification Search ................. 445/50, 445/51, 23, 24, 25; 438/36, 166, 354, 674, 438/679, 680, 681
See application file for complete search history.

(56) References Cited

U.S. PATENT DOCUMENTS

| | | | |
|---|---|---|---|
| 2,351,536 A | 6/1944 | Osterberg et al. ............ 117/107 |
| 2,435,997 A | 2/1948 | Bennett ....................... 91/12.2 |
| 2,906,637 A * | 9/1959 | Auphan ....................... 427/107 |
| 3,312,190 A | 4/1967 | Bradshaw ................... 118/49.1 |
| 3,543,717 A | 12/1970 | Adachi |
| 3,636,305 A | 1/1972 | Passmore .................... 219/271 |
| 3,756,193 A | 9/1973 | Carmichael et al. ....... 118/49.1 |
| 3,931,490 A | 1/1976 | Grothe et al. ............... 219/121 |
| 3,931,789 A | 1/1976 | Kakei et al. .................. 118/49 |
| 3,971,334 A | 7/1976 | Pundsack ....................... 118/5 |
| 4,023,523 A | 5/1977 | Ing ............................. 118/49.1 |
| 4,187,801 A | 2/1980 | Monk .......................... 118/729 |
| 4,225,805 A | 9/1980 | Smithgall et al. ........... 313/481 |
| 4,233,937 A | 11/1980 | Steube ........................ 118/727 |
| 4,405,487 A | 9/1983 | Harrah et al. ............... 252/194 |

(Continued)

FOREIGN PATENT DOCUMENTS

DE  2834806  2/1980

(Continued)

OTHER PUBLICATIONS

Search Report (Application No. 03007979.2; EP6378), Dated Sep. 6, 2004.

(Continued)

*Primary Examiner*—Joseph Williams
(74) *Attorney, Agent, or Firm*—Cook, Alex, McFarron, Manzo, Cummings & Mehler, Ltd.

(57) ABSTRACT

In this embodiment, an interval distance between a desposition source holder 17 and an object on which deposition is performed (substrate 13) is reduced to 30 cm or less, preferably 20 cm or less, more preferably 5 to 15 cm, and a deposition source holder 17 is moved in an X direction or a Y direction in accordance with an insulator (also called a bank or a barrier) in deposition, and a shutter 15 is opened or closed to form a film. The present invention can cope with an increase in size of a deposition apparatus with a further increase in size of a substrate in the future.

40 Claims, 12 Drawing Sheets

SECTIONAL VIEW IN Y DIRECTION
(IN THE MIDDLE OF FILM FORMATION)

U.S. PATENT DOCUMENTS

| | | | |
|---|---|---|---|
| 4,446,357 A | 5/1984 | Barshter | 219/275 |
| 4,469,719 A | 9/1984 | Martin | |
| 4,543,467 A | 9/1985 | Eisele et al. | 219/271 |
| 4,592,306 A | 6/1986 | Gallego | 118/719 |
| 4,596,735 A | 6/1986 | Noguchi et al. | |
| 4,602,192 A | 7/1986 | Nomura et al. | 315/169.3 |
| 4,627,989 A | 12/1986 | Feuerstein et al. | 427/10 |
| 4,672,265 A | 6/1987 | Eguchi et al. | 313/504 |
| 4,769,292 A | 9/1988 | Tang et al. | 428/690 |
| 4,885,211 A | 12/1989 | Tang et al. | 428/457 |
| 4,897,290 A | 1/1990 | Terasaka et al. | 427/162 |
| 4,951,601 A | 8/1990 | Maydan et al. | 118/719 |
| 5,190,590 A | 3/1993 | Suzuki et al. | 118/664 |
| 5,258,325 A | 11/1993 | Spitzer et al. | 437/86 |
| 5,259,881 A | 11/1993 | Edwards et al. | 118/719 |
| 5,310,410 A | 5/1994 | Begin et al. | 29/25.01 |
| 5,429,884 A | 7/1995 | Namiki et al. | 428/690 |
| 5,512,320 A | 4/1996 | Turner et al. | 427/255 |
| 5,534,314 A | 7/1996 | Wadley et al. | 427/585 |
| 5,550,066 A | 8/1996 | Tang et al. | 437/40 |
| 5,643,685 A | 7/1997 | Torikoshi | 428/690 |
| 5,670,792 A | 9/1997 | Utsugi et al. | 257/59 |
| 5,701,055 A | 12/1997 | Nagayama et al. | 313/504 |
| 5,817,366 A | 10/1998 | Arai et al. | 427/66 |
| 5,844,363 A | 12/1998 | Gu et al. | 313/506 |
| 5,902,688 A | 5/1999 | Antoniadis et al. | 428/690 |
| 5,904,961 A | 5/1999 | Tang et al. | 427/66 |
| 5,906,857 A | 5/1999 | McKee et al. | 427/8 |
| 5,921,836 A | 7/1999 | Nanto et al. | 445/24 |
| 5,935,395 A | 8/1999 | Ouellet et al. | 204/298.07 |
| 5,943,600 A | 8/1999 | Ngan et al. | 438/653 |
| 5,945,967 A | 8/1999 | Rallison et al. | 345/32 |
| 5,972,183 A | 10/1999 | Krueger et al. | 204/298.07 |
| 6,001,413 A | 12/1999 | Matsuura et al. | 427/64 |
| 6,011,904 A | 1/2000 | Mattord | 392/389 |
| 6,023,308 A | 2/2000 | Takemura | 349/42 |
| 6,049,167 A | 4/2000 | Onitsuka et al. | 313/512 |
| 6,124,215 A | 9/2000 | Zheng | 438/760 |
| 6,132,280 A | 10/2000 | Tanabe et al. | 445/58 |
| 6,132,805 A | 10/2000 | Moslehi | 427/248.1 |
| 6,149,392 A | 11/2000 | Conte | 417/51 |
| 6,179,923 B1 | 1/2001 | Yamamoto et al. | 118/719 |
| 6,237,529 B1 | 5/2001 | Spahn | 118/726 |
| 6,244,212 B1 | 6/2001 | Takacs et al. | 118/723 |
| 6,280,861 B1 | 8/2001 | Hosokawa et al. | 428/690 |
| 6,294,892 B1 | 9/2001 | Utsugi et al. | 318/640 |
| 6,296,894 B1 | 10/2001 | Tanabe et al. | 427/8 |
| 6,299,746 B1 | 10/2001 | Conte et al. | 204/298.07 |
| 6,319,321 B1 | 11/2001 | Hiraga et al. | 118/666 |
| 6,326,726 B1 | 12/2001 | Mizutani et al. | 313/504 |
| 6,333,065 B1 | 12/2001 | Arai et al. | 427/66 |
| 6,337,105 B1 | 1/2002 | Kunieda et al. | 427/248.1 |
| 6,340,501 B1 | 1/2002 | Kamiyama et al. | 427/255.6 |
| 6,380,081 B1 | 4/2002 | Lee | 438/681 |
| 6,403,392 B1 | 6/2002 | Burrows et al. | 438/22 |
| 6,432,561 B1 | 8/2002 | Yamazaki | 428/690 |
| 6,469,439 B2 | 10/2002 | Himeshima et al. | 313/506 |
| 6,482,752 B1 | 11/2002 | Yamazaki et al. | 438/758 |
| 6,482,852 B2 | 11/2002 | Shakespeare et al. | 514/506 |
| 6,495,198 B2 | 12/2002 | Peng | 427/66 |
| 6,528,108 B1 | 3/2003 | Kawamura | 427/8 |
| 6,537,607 B1 | 3/2003 | Swanson | 427/66 |
| 6,633,121 B2 | 10/2003 | Eida et al. | 313/504 |
| 6,641,674 B2 | 11/2003 | Peng | 118/727 |
| 6,649,210 B2 | 11/2003 | Tokailin et al. | |
| 6,660,409 B1 | 12/2003 | Komatsu et al. | 428/690 |
| 6,696,096 B2 | 2/2004 | Tsubaki et al. | 427/69 |
| 6,776,880 B1 | 8/2004 | Yamazaki | 204/192.15 |
| 6,827,622 B2 | 12/2004 | Yamada et al. | |
| 6,830,626 B1 | 12/2004 | Smith | 118/726 |
| 2001/0006827 A1 | 7/2001 | Yamazaki et al. | |
| 2001/0009154 A1 | 7/2001 | Nguyen et al. | 134/1 |
| 2001/0022272 A1 | 9/2001 | Plester et al. | 204/192.38 |
| 2002/0009538 A1 | 1/2002 | Arai | |
| 2002/0011205 A1 | 1/2002 | Yamazaki et al. | 118/620 |
| 2002/0030443 A1 | 3/2002 | Konuma et al. | 313/504 |
| 2002/0076847 A1 | 6/2002 | Yamada et al. | 438/34 |
| 2002/0081372 A1 | 6/2002 | Peng | 427/64 |
| 2002/0084032 A1 | 7/2002 | Jeng et al. | 156/345.31 |
| 2002/0155632 A1 | 10/2002 | Yamazaki et al. | |
| 2002/0179013 A1 | 12/2002 | Kido et al. | |
| 2002/0187265 A1 | 12/2002 | Mori et al. | 427/282 |
| 2002/0192499 A1 | 12/2002 | Tokailin et al. | |
| 2002/0197418 A1 | 12/2002 | Mizukami et al. | 427/596 |
| 2002/0197760 A1 | 12/2002 | Yamazaki et al. | 438/48 |
| 2003/0015140 A1 | 1/2003 | Van Slyke et al. | 118/723 |
| 2003/0017259 A1 | 1/2003 | Yamada et al. | 427/66 |
| 2003/0024479 A1 | 2/2003 | Kashiwaya et al. | 118/726 |
| 2003/0101937 A1 | 6/2003 | Van Slyke et al. | 118/726 |
| 2003/0124764 A1 | 7/2003 | Yamazaki et al. | |
| 2003/0162314 A1 | 8/2003 | Yamazaki et al. | 438/46 |
| 2003/0180457 A1 | 9/2003 | Murakami et al | 427/237 |
| 2003/0219530 A1 | 11/2003 | Yamazaki et al. | 427/66 |
| 2004/0035366 A1 | 2/2004 | Keum et al. | 118/726 |
| 2004/0096694 A1 | 5/2004 | Tokailin et al. | |
| 2004/0139984 A1 | 7/2004 | Yamazaki et al. | |
| 2005/0005850 A1 | 1/2005 | Yamazaki | 118/719 |

FOREIGN PATENT DOCUMENTS

| | | |
|---|---|---|
| DE | 44 22 697 C1 | 1/1996 |
| EP | 0 955 791 | 11/1999 |
| EP | 1 071 117 A2 | 1/2001 |
| EP | 1113087 | 7/2001 |
| EP | 1319732 | 6/2003 |
| JP | 54-127877 | 10/1979 |
| JP | 57-123973 | 8/1982 |
| JP | 58-177463 | 10/1983 |
| JP | 60-032361 | 3/1985 |
| JP | 60-121616 | 6/1985 |
| JP | 61-15969 | 1/1986 |
| JP | 63-079959 | 4/1988 |
| JP | 63-186763 | 11/1988 |
| JP | 64-042392 | 2/1989 |
| JP | 02-173261 | 7/1990 |
| JP | 04-116169 | 4/1992 |
| JP | 4-268069 | 9/1992 |
| JP | 05-304197 | 11/1993 |
| JP | 06-088233 | 3/1994 |
| JP | 06-306181 | 11/1994 |
| JP | 7-18426 | 1/1995 |
| JP | 07-192866 | 7/1995 |
| JP | 07-252671 | 10/1995 |
| JP | 8-111285 | 4/1996 |
| JP | 9-16960 | 1/1997 |
| JP | 09-209127 | 8/1997 |
| JP | 09-256142 | 9/1997 |
| JP | 9-256156 | 9/1997 |
| JP | 10-041069 | 2/1998 |
| JP | 10-168559 | 6/1998 |
| JP | 10-195639 | 7/1998 |
| JP | 10-214682 | 8/1998 |
| JP | 10-335062 | 12/1998 |
| JP | 11-229123 | 8/1999 |
| JP | 2000-348859 | 12/2000 |
| JP | 2001-093667 | 4/2001 |
| JP | 2001-152336 | 6/2001 |
| JP | 2001-357973 | 12/2001 |
| JP | 2002-208480 | 7/2002 |
| JP | 2003-034591 | 2/2003 |
| JP | 2003-045649 | 2/2003 |
| JP | 2003-045650 | 2/2003 |
| JP | 2003-095787 | 4/2003 |
| JP | 2004-035964 A | 2/2004 |

| WO | WO98/54375 | 12/1998 |
| WO | WO 01/31081 | 5/2001 |
| WO | WO 01/79581 | 10/2001 |

OTHER PUBLICATIONS

Tang, C.W. et al, "Organic Electroluminescent Diodes," Appl. Phys. Lett., vol. 51, No. 12, pp. 913-915, Sep. 21, (1987).

Van Slyke, S.A. et al, "Blue Organic Light Emitting Devices," Proceedings of the Electroluminescence Workshop, pp. 195-200, (1996), no month.

Fukuda, Y. et al, "An Organic LED Display Exhibiting Pure RGB Colors," Synthetic Metals, vol. 111-112, pp. 1-6, (2000), no month.

Van Slyke, S., et al, "27.2: Linear Source Deposition of Organic Layers for Full-Color OLED," SID 02 Digest: SID International Symposium Digest of Technical Papers, 2002, pp. 886-889.

* cited by examiner

SECTIONAL VIEW IN X DIRECTION

SECTIONAL VIEW IN Y DIRECTION
(IN THE MIDDLE OF FILM FORMATION)

PLAN VIEW

PERSPECTIVE VIEW

PLAN VIEW

PLAN VIEW
(WHEN DEPOSITION SOURCE IS SET)

PERSPECTIVE VIEW

PLAN VIEW

CONVENTIONAL CRUCIBLE SHAPE

CONVENTIONAL DEPOSITION APPARATUS

METHOD OF FABRICATING LIGHT-EMITTING DEVICE AND APPARATUS FOR MANUFACTURING LIGHT-EMITTING DEVICE

BACKGROUND OF THE INVENTION

1. Field of the Invention

The present invention relates to a film-forming device for forming a film of materials which can be formed into a film by using a vapor deposition (hereinafter, vapor deposition materials), and a light-emitting device which is typified by EL element. Especially, the present invention is effective in forming a light-emitting device by using organic materials as vapor deposition materials.

2. Description of the Related Art

In recent years, research on a light-emitting device having EL element as a self-luminous element has been activated, and specifically, a light-emitting device employing organic materials as EL materials attracts attention. This light-emitting device is also referred to as an organic EL display (OELD: Organic EL Display ) or organic light-emitting diode (OLED: Organic Light Emitting Diode).

EL element includes a layer containing an organic compound that provides an electro luminescence generated by being applied with an electric field (hereinafter, as EL layer), an anode, and a cathode. The luminescence of the organic compound includes light emission (fluorescent radiation) generated when moving back from a singlet excitation state to the normal state and light emission (phosphorescence) when moving back from a triplet excitation state to the normal state. The light-emitting device manufactured by a film-forming device and a method of forming a film according to the invention may be applied to both of the cases employing these light-emissions.

The light-emitting device is characterized by having no limitation in angle of visibility because it is a self-luminous type, which is different from the liquid crystal display device. In other words, it is superior to the liquid crystal display as a display to be used in the open air, and usages in various ways have been proposed.

EL element has such a structure that the EL layer is interposed between a pair of electrodes, and the EL layer generally has a laminated structure. Typically, such a laminated structure as "hole transport layer/light emitting layer/electron-transport layer" is employed. This structure has very high light-emitting efficiency, and most of the light-emitting devices that are currently under research and development employ this structure.

The structure laminating in order of "hole injection layer/hole transport layer/light emitting layer/electron transport layer, or hole injection layer/hole transport layer/light emitting layer/electron transport layer/electron injection layer may also be employed on the anode. It is also possible to dope the fluorescent pigment to the light-emitting layer. These layers may be formed only from low molecular materials or only from high molecular materials.

In this specification, all the layers provided between the cathode and the anode are referred to as EL layer as a generic name. Therefore, the hole injection layer, the hole transport layer, the light emitting layer, the electron transport layer, and electron injection layer are all included in the EL layer.

In this specification, the light-emitting element formed with the cathode, the EL layer, and the anode is referred to as the EL element, which includes a system in which the EL layer is formed between two kinds of striped electrodes arranged so as to be orthogonal with each other (simple matrix system) and a system in which the EL layer is formed between the pixel electrode and the opposite electrode connected to the TFT (Thin Film Transistor) and arranged in matrix (active matrix system).

EL materials for forming EL layer is extremely susceptible to be deteriorated; it is easily oxidized and deteriorated due to presence of oxygen or water. On that account, photolithography cannot be carried out after forming a film. In order to be patterned, the EL layer is necessary to separate a mask having an opening portion (hereinafter, a vapor deposition mask) upon forming a film. Therefore, almost sublimed organic materials are adhered to an inner wall of a film-forming chamber or an adhesion prevention shield (a protecting plate for preventing an adhesion of vapor deposition materials from an inner wall of a film-forming chamber).

In order to improve uniformity of film thickness, a conventional vapor deposition device has been grown in size since internals between a substrate and an evaporation source are widened. Further, a film-forming speed is lowered, since the internal between the substrate and an evaporation source are wide.

In addition, in the conventional vapor deposition device, a usability of high-priced EL materials is so low as 1% or less that the production cost of a light-emitting device is very expensive.

An EL material is very expensive, and the price per gram of the EL material is far higher than that of gold. The EL material is to be used as efficiently as possible. However, in the conventional evaporation device, the use efficiency of an expensive EL material remains low.

SUMMARY OF THE INVENTION

It is an object of the present invention to provide a deposition apparatus which improves using efficiency of an EL material and which excels in uniformity and throughput.

A conventional deposition apparatus, as shown in FIG. 11B, has a structure in which a substrate is separated from a deposition source by 1 m or more and rotated to obtain a uniform film. It is difficult to increase in size of the deposition apparatus in accordance with a substrate, which continuously increases in size in recent years.

For example, substrate sizes, 320 mm×400 mm, 370 mm×470 mm, 550 mm×650 mm, 600 mm×720 mm, 680 mm×880 mm, 1000 mm×1200 mm, 1100 mm×1250 mm, 1150 mm×1300 mm, and the like are used in a mass-production factory.

The present invention has the following characteristic feature. A mechanism which moves a deposition source is arranged in a film forming chamber, and the deposition source is moved in accordance with an insulator (also called a bank or a barrier) which partially covers an electrode serving as a cathode or an anode in deposition, so that a film thickness distribution, the use efficiency of a deposition material, and a throughput are increased.

The present invention has the following characteristic feature. An opening/closing means (shutter or the like) is arranged in the deposition apparatus, movement of the deposition apparatus or the opening/closing operation of the shutter is performed in accordance with an insulator (also called a bank or a barrier) in deposition to increase the use efficiency of an EL material.

EL materials for forming an EL layer are roughly classified into a low-molecular-based (monomer-base) material and a high-molecular-based (polymer-based) material. The low-molecular-based material mainly forms a film by deposition. The EL materials may include an inorganic material (silicon or the like).

In addition, in deposition, an interval distanced between a substrate and a deposition source is typically decreased to 30 cm or less, so that an amount of deposition material scattered to other positions than the substrate is reduced to increase the use efficiency of the deposition material. Since a mechanism for adjusting the interval distance d between the substrate and the deposition source is employed, a deposition holder may be moved in a Z direction. In this case, the deposition holder is moved in the Z direction before the deposition to control the interval distance. However, in the deposition, the moving direction of the deposition holder is an X direction or a Y direction.

When the interval distance d between the substrate and the deposition source is decreased, a film forming chamber can be reduced in size. When the capacity of the film forming chamber is reduced in size by reducing the size of the film forming chamber, a time for vacuum evacuation can be reduced, and a total amount of impurities existing in the film forming chamber can be decreased. Thus, impurities (water, oxygen, or the like) mixed in a high-purity EL material can be well prevented. According to the present invention, super-high-purity deposition material can be achieved in the future.

In addition, the present invention makes it possible to cause a deposition apparatus to further cope with increase in size.

The configuration of the invention disclosed in this specification is a method of fabricating a light-emitting device in which a material containing an organic compound is deposited from a deposition source arranged in opposition to a substrate to form a film containing the organic compound on a first electrode arranged on the substrate and to form a second electrode on the film containing the organic compound, comprising:

the step of moving the deposition source in accordance with a region partitioned by an insulator partially covering the first electrode and forming the film containing organic compound on the first electrode; and the step of forming the second electrode on the film containing the organic compound.

In the configuration, the insulator is arranged in the form of stripes or a grating.

In the configuration, in the deposition, an interval distance between the deposition source and the substrate is not more than 30 cm, more preferably, 5 cm to 15 cm. When an interval distance d between the deposition source and the substrate decreases, and a plurality of crucibles are arranged in a deposition holder to perform codeposition, an interval distance between the crucibles is preferably reduced as much as possible. For example, it is preferable that the inside of a crucible 500 is partitioned as shown in FIG. 5 into sections, and that heating means 502 to 505 for heating the respective sections are independently arranged to appropriately adjust the temperatures of the sections.

In the configuration, in the deposition, the deposition source moves in an X direction or a Y direction. In each of the configurations, a mask is arranged between the substrate and the deposition source, and consists of a metal material having a small thermal expansion coefficient. When the mask is cleaned, a plasma may be generated by a high-frequency power supply connected to the mask to remove a deposition material adhered to the mask.

In the configuration, the moving direction of the deposition source and the longitudinal direction of the region are equal to each other.

In the configuration, the first electrode is a cathode or an anode of a light-emitting element electrically connected to a TFT.

In the configuration, a shutter which is opened and closed is arranged in the deposition source, and the shutter is opened in accordance with a region partitioned by the insulator in deposition. In the configuration, a shutter which is opened and closed is arranged in the deposition source, the shutter moves together with the deposition source. A thickness gauge (thickness sensor, thickness monitor, or the like) may move together with the deposition source.

A manufacturing apparatus for realizing the above configurations, as shown in FIG. 1 as an example, is a manufacturing apparatus having a film forming apparatus for depositing a deposition material from a deposition source arranged in opposition to a substrate to form a film on the substrate, wherein the deposition source, means for moving the deposition source, and a shutter arranged in the deposition source are arranged in a film forming chamber in which the substrate is placed, and the deposition source and the shutter are moved, and the shutter is opened and closed to selectively form a film.

In the configuration, the film forming chamber communicates with a vacuum evacuation process chamber for evacuating the film forming chamber.

The manufacturing apparatus may be a multi-chamber type manufacturing apparatus.

As main processes which may mix an impurity such as oxygen or water with an EL material or a metal material to be deposited, a process of setting the EL material in the film forming chamber before deposition, a deposition process, or the like may be considered.

Therefore, a glove is arranged in a pre-process chamber communicating with the film forming chamber, the deposition source is moved from the film forming chamber to the pre-process chamber as a whole, and a deposition material is preferably set on the deposition source in the pre-process chamber. More specifically, the manufacturing apparatus in which the deposition source moves to the pre-process chamber is used. In this manner, the deposition source can be set while keeping a degree of cleanness of the film forming chamber.

A vessel for reserving an EL material is put in a brown glass bottle, and the brown glass bottle is closed by a plastic lid (cap). The degree of airtightness of the vessel for reserving the EL material may be insufficient.

In the conventional technique, film formation is performed by a deposition method, a predetermined amount of deposition material put in the vessel (glass bottle) is pulled out and transferred to a bottle (typically, a crucible or a deposition boat) arranged at a position opposing an object on which a film is to be formed in the deposition apparatus. However, in this transfer operation, an impurity may be mixed. More specifically, oxygen, water, or other impurities may serve as one of factors for deteriorating an EL element.

When the deposition material is transferred from the glass bottle to the vessel, for example, the transfer operation may be performed with a hand of a human being in the pre-process chamber having a glove or the like in the deposition apparatus. However, when the glove is arranged in the pre-process chamber, the pre-process chamber cannot be evacuated, and the operation is performed in the atmosphere. Even if the operation is performed in a nitrogen atmosphere, it is difficult to reduce water or oxygen in the pre-process chamber as much as possible. Although a robot may be used, since an evaporated material is powdery, a robot for transferring the evaporated material cannot be easily fabricated. Therefore, it is difficult to obtain a consistent closed system in which the steps from the step of forming an EL layer on a lower electrode to the step of forming an upper electrode are automated to make it possible to avoid an impurity from being mixed with a deposition material.

Therefore, the present invention employs a manufacturing system in which the conventional vessel, typically, a brown glass bottle or the like is not used as a vessel for reserving an EL material, and the EL material or a metal material are directly stored in a vessel which is expected to be arranged in a deposition apparatus to perform deposition before conveyance, so that an impurity can be prevented from being mixed with a high-purity deposition material. When the deposition material of the EL material is directly stored, the resultant deposition material is not separately stored, and sublimation purification may be directly performed to a vessel which is expected to be arranged in the deposition apparatus. The present invention makes it possible to cause the deposition apparatus to further cope with a super-high-purity deposition material in the future. The metal material is directly stored in the vessel which is expected to be arranged in the deposition apparatus to perform deposition by resistor heating.

A light-emitting device manufacturer which uses the deposition apparatus desirably requests a material manufacturer which fabricates or sells the deposition material to perform the operation of directly storing the deposition material in the vessel arranged in the deposition apparatus.

For example, as shown in FIG. 6, a branch (or projection) may be formed in a vessel (crucible), and sublimation purification may be directly performed to the branch. The branch may consist of titanium or the like. The titanium branch is effective to uniformly heat the deposition material in deposition.

For all that a high-purity EL material is provided by a material manufacturer, the possibility of mixing an impurity with the EL material does not become zero if the conventional transfer operation in a light-emitting device manufacturer is being performed. The degree of purity of the EL material cannot be maintained, and the degree of purity is limited. According to the present invention, the light-emitting device manufacturer and the material manufacturer cooperate to attempt to reduce an impurity to be mixed, so that, while keeping a very-high-purity EL material obtained by the material manufacturer, deposition can be performed by the light-emitting device manufacturer without degrading the purity.

DETAILED DESCRIPTION OF THE PREFERRED EMBODIMENTS

Embodiments of the present invention will be described below.

Embodiments

Figure 1A:
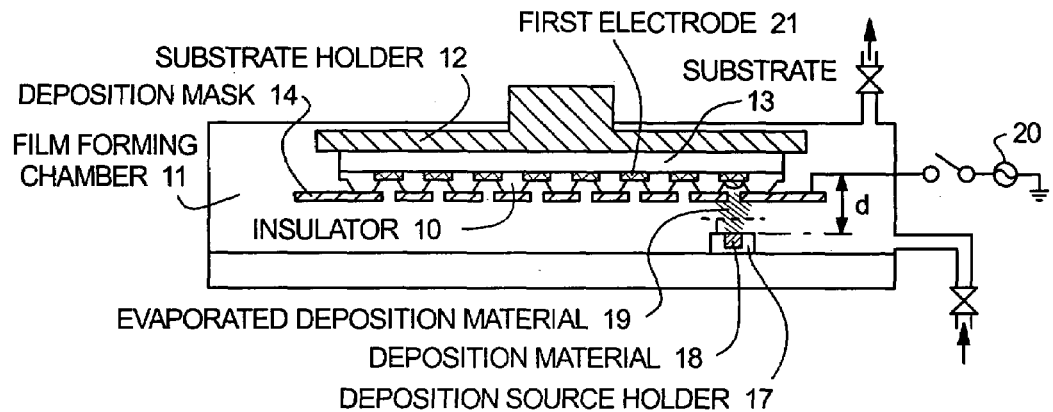
FIGS. 1A to 1C are diagrams showing an embodiment of the present invention.
Figure 1B:
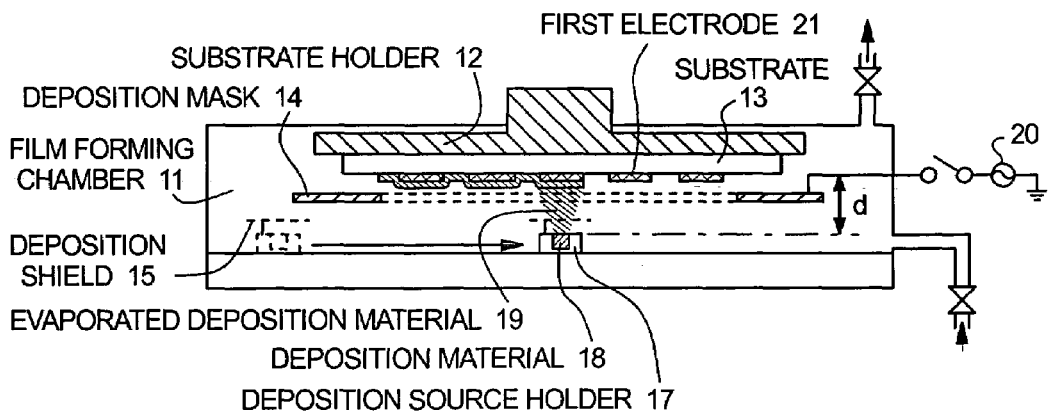
Figure 1C:
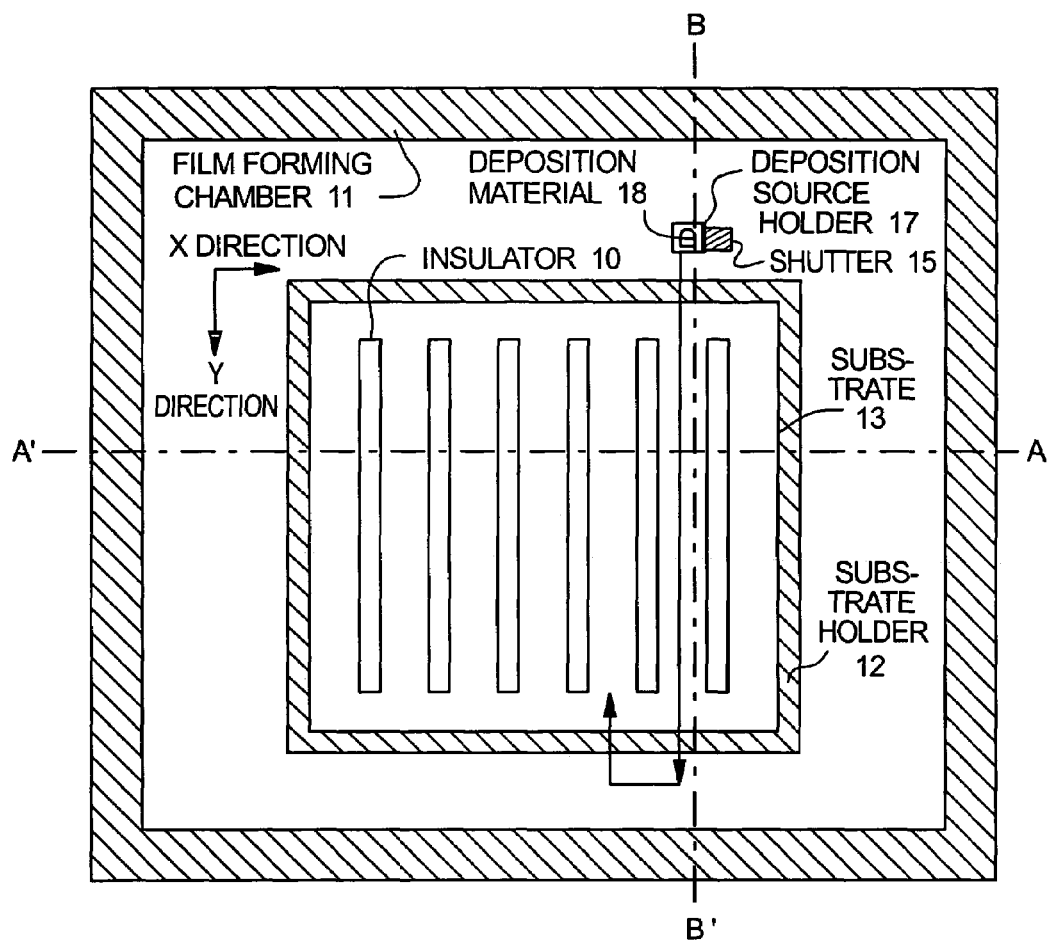

A film forming apparatus is shown in FIGS. 1A and 1B. FIG. 1A is a sectional view in an X direction (section along an A–A' dotted line), FIG. 1B is a sectional view in a Y direction (section along a B–B' dotted line), and FIG. 1C is an upper view. FIG. 1B is a sectional view obtained in the middle of film formation.

In FIG. 1, reference numeral 11 denotes a film forming chamber; 12, a substrate holder; 13, a substrate; 14, a deposition mask; 15, a deposition shield (deposition shutter); 17, a deposition source holder; 18, a deposition material; and 19, evaporated deposition material.

Deposition is performed in the film forming chamber 11 which is evaporated to a degree of vacuum of $5 \times 10^{-3}$ Torr (0.665 Pa) or less, preferably, $10^{-4}$ to $10^{-6}$ Pa. In the deposition, a deposition material is vaporized (evaporated) by resistor heating in advance. When the shutter (not shown) is opened in the deposition, the deposition material scatters toward the substrate 13. The evaporated deposition material 19 scatters above, and is selectively deposited on the substrate 13 through an opening formed in the deposition mask 14.

In the deposition apparatus, the deposition source (deposition source holder) is constituted by a crucible, a heater arranged outside the crucible through a soaking member, a heat insulating layer formed outside the heater, an external cylinder which stores these members therein, a cooling pipe winded outside of the external cylinder, and a shutter device for opening/closing an opening of the external cylinder including the opening of the crucible. In this specification, the crucible is a cylindrical vessel consisting of a material such as a sintered compact containing BN, a sintered compact containing BN and AlN, quartz, or graphite and having a relatively large opening and can withstand a high temperature, a high pressure, a reduced pressure.

A film forming rate, a moving speed of the deposition source, and an opening/closing operation of the shutter is preferably designed to be controlled by a microcomputer.

In the deposition apparatus shown in FIG. 1, in deposition, an interval distance d between the substrate 13 and the deposition source holder 17 is reduced to 30 cm or less, preferably 20 cm or less, more preferably 5 cm to 15 cm, so that the use efficiency and throughput of the deposition material can be remarkably improved.

Figure 2A:
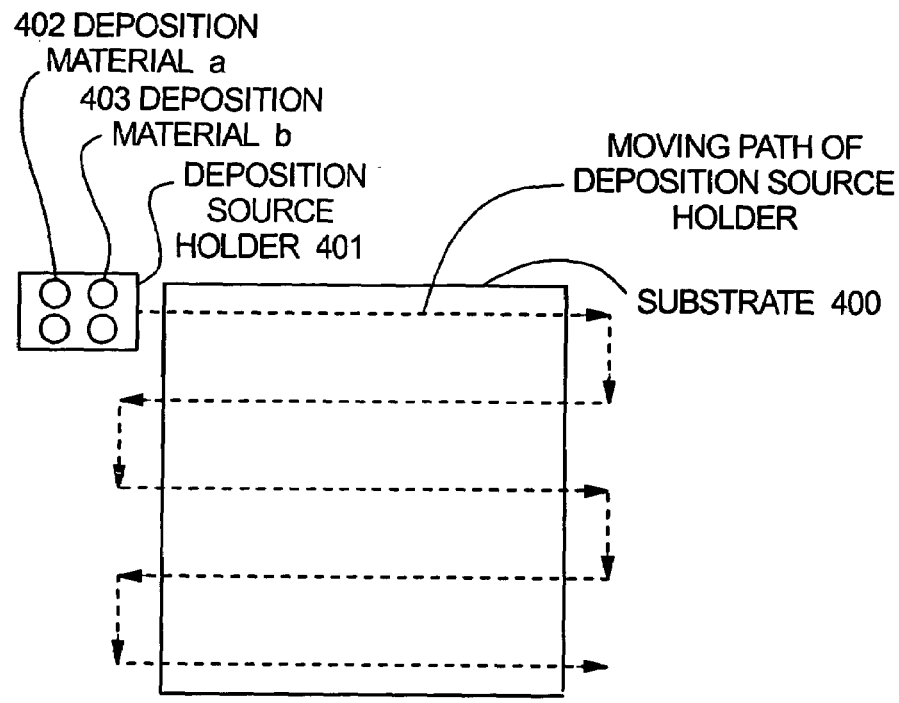
FIGS. 2A and 2B are diagrams showing an embodiment of the present invention.
Figure 2B:
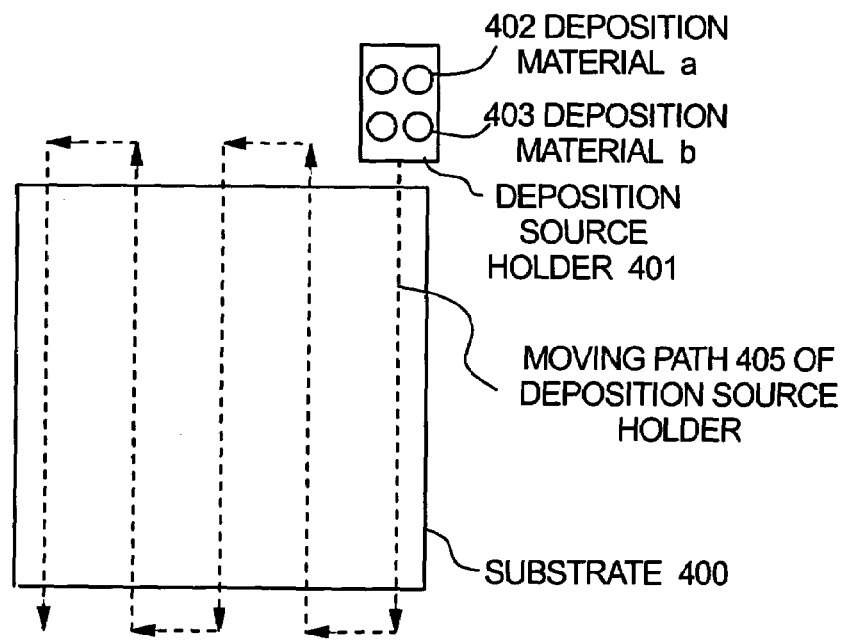

The deposition source holder 17 has a mechanism which can move parallel the deposition source holder 17 in the X direction or the Y direction in the film forming chamber 11. In this case, the mechanism moves the deposition source holder 17 on a two-dimensional plane. For example, as shown in FIG. 2A or FIG. 2B, a deposition source holder 401 is moved in zigzags. In FIG. 2A, reference numeral 400 denotes a substrate; 402, a deposition material a; 403, a deposition material b; and 404, a moving path of the deposition holder. The moving path 404 of the deposition source holder 401 is zigzag with respect to the substrate 400 as shown in FIG. 2A. The deposition source holder 401 may be reciprocated through the moving path 404 more than once. A thickness may be controlled by the moving speed, moving pitch, and the number of reciprocating motions of the deposition source holder 401.

For example, the deposition source holder 17 may be moved in the X direction or the Y direction at a rate of 30 cm/min to 300 cm/min.

In addition, as shown in FIG. 1C, when an insulator 10 is arranged in the Y direction, the deposition source holder 17 may be moved as shown in FIG. 2B. As shown in FIG. 2B, a moving path 405 of the deposition source holder 401 is zigzag with respect to the substrate 400. The moving pitch of the deposition source holder may be appropriately adjusted to the interval of the insulators. The insulator 10 is arranged in the form of stripes to cover the ends of first electrodes 21.

When the deposition source holder 401 is reciprocated, a forward path is made different from a backward path to improve the uniformity of the film thickness.

A deposition shutter is arranged in the movable deposition source holder 17. An organic compound held by one deposition source holder need not be one organic compound, and a plurality of organic compounds may be held by the deposition source holder. For example, in addition to a material of one type held by the deposition source as a luminescent organic compound, another organic compound (dopant material) which can serve as a dopant may be held by the deposition source. An organic compound layer to be deposited consists of a host material and a luminescent material (dopant material) having excitation energy lower than that of the host material. The excitation energy of the dopant is preferably designed to be lower than the excitation energy of a hole transporting region and the excitation energy of an electron transporting layer. For this reason, molecular excitons of the dopant can be prevented from being diffused, and the dopant can be effectively caused to emit light. In addition, when the dopant is a carrier trap type material, the recombination efficiency of carriers can also be improved. The present invention also includes a case wherein a material which can convert triplet excitation energy into light is added as a dopant to a mixing region. In formation of the mixing region, the mixing region may have a concentration gradient.

Figure 3:
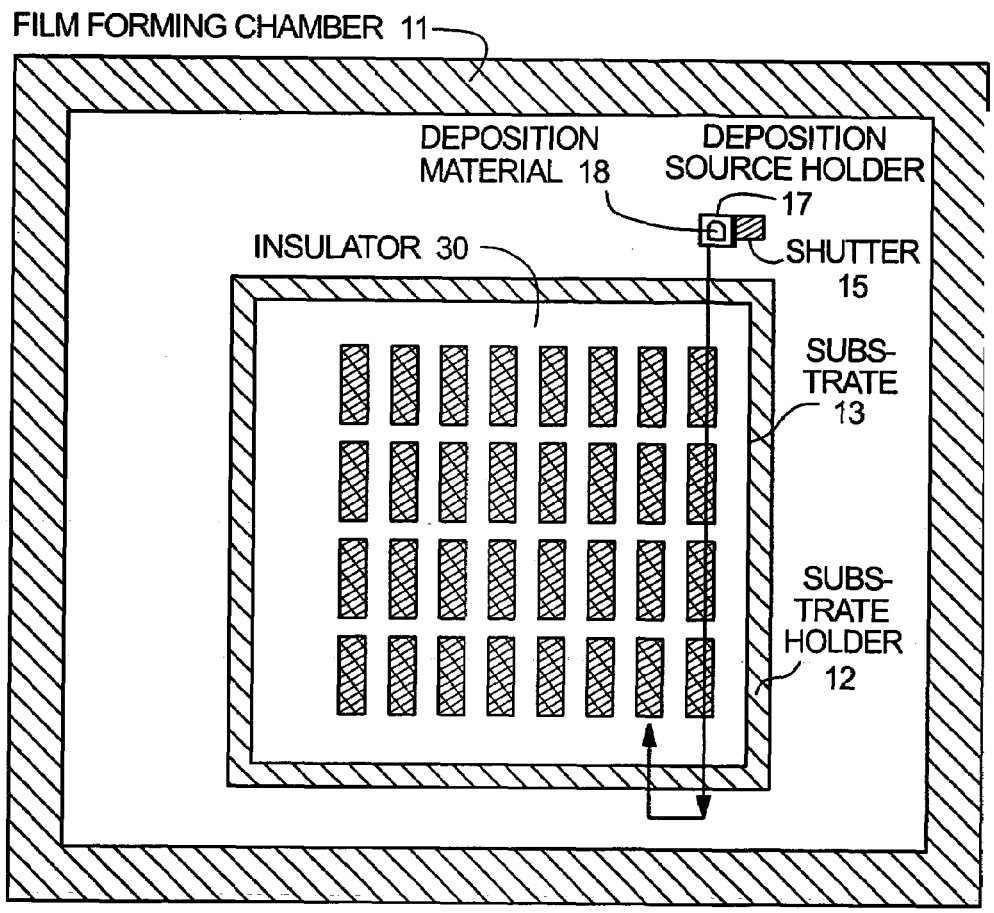
FIG. 3 is a diagram showing an embodiment of the present invention.

When an insulator 30 is arranged to surround one pixel as shown in FIG. 3, the deposition source holder may be moved, and the deposition shutter may be appropriately opened/closed to form a film. The arrangement of the insulator 30 shown in FIG. 3 is also called a grating-like arrangement.

When a plurality of vessels (crucibles or deposition boats which store an organic compound) arranged in one deposition source holder, the fitting angles of the crucibles are desirably biased such that evaporation directions (evaporation centers) cross at the position of an object on which deposition is performed to mix organic compounds with each other.

For example, codeposition may be performed by using the deposition material a 402 in FIG. 2A as a host material and using the deposition material b 403 as dopant materials. In FIG. 2A, codeposition can be performed by combinations of four deposition materials (two types of host materials serving as the deposition material a 402, and two types of dopant materials serving as the deposition material b 403). In FIG. 2A, four deposition shutters are arranged, respectively, and may be appropriately opened/closed to form a film.

When a pixel size is small (or when an interval distance between the insulators is small), as shown in FIG. 5, the inside of a crucible 500 may be divided into four sections by a partition 501, and codeposition may be performed by appropriately performing deposition in each section by a corresponding heating means to accurately form a film.

Since an interval distance d between the substrate 13 and the deposition source holder 17 is typically reduced to 30 cm or less, preferably 5 cm to 15 cm, the deposition mask 14 may also be heated. Therefore, as the deposition mask 14, a metal material (e.g., a high-melting-point metal such as tungsten, tantalum, chromium, nickel, or molybdenum, or an alloy containing one or some of these elements, stainless steel, Inconel, or Hastelloy) having a small thermal expansion coefficient at which thermal deformation does not easily occur is desirably used. For example, an alloy having a small thermal expansion coefficient and consisting of nickel (42%) and iron (58%) is used. Since a deposited material adhered to a mask is evaporated to perform cleaning, it is preferable that a plasma is generated in the film forming chamber to evaporate the deposited material adhered to the deposition mask and to discharge the evaporated material outside the film forming chamber. Therefore, the mask preferably consists of a conductive material. The mask or another electrode is arranged, and a high-frequency power supply 20 is connected to one of the mask and the electrode as a characteristic feature. The above configuration has a gas supply means for supplying one or more types of gases selected from Ar, H, F, $NF_3$, and O into the film forming chamber and a means for discharging an evaporated deposited material. With the configuration, the film forming chamber can be cleaned when maintenance is performed, without exposing the inside of the film forming chamber to the atmospheric air.

In order to cool the heated deposition mask, a mechanism for circulating a coolant (cooling water or cooling gas) to the deposition mask may be arranged.

The deposition mask 14 is used when a deposition film is selectively formed on a first electrode 21 (cathode or anode), and is not necessary when a deposition film is formed on the entire surface on the electrode.

The substrate holder 12 has a permanent magnet to fix the deposition mask consisting of a metal by magnetic attraction. The substrate 13 sandwiched between the substrate holder 12 and the permanent magnet is also fixed. The case in which the deposition mask is in tight contact with the substrate 13 is exemplified. However, a substrate holder or a deposition mask holder which fixes the substrate or the deposition mask with some interval may be appropriately arranged.

The film forming chamber 11 communicates with a vacuum evacuation process chamber for evacuating the film forming chamber. In the vacuum evacuation process chamber, a magnetic-floating-type turbo molecular pump, a cryopump, or a dry pump is arranged. In this manner, a target degree of vacuum of a convey chamber can be made $10^{-5}$ to $10^{-6}$ Pa. Furthermore, back diffusion of an impurity from the pump and the discharge system can be controlled. In order to prevent an impurity from being supplied into the apparatus, as a gas to be supplied, an inert gas such as a nitrogen gas or a noble gas is used. As the gas supplied into the apparatus, a gas which is purified by a gas purifier before the gas is supplied into the apparatus. Therefore, the gas purifier must be arranged to supply the gas into the film forming apparatus after the gas is purified. Therefore, oxygen, water, and other impurities contained in the gas can be removed in advance. For this reason, the impurity can be prevented from being supplied into the apparatus.

The present invention having the above configuration will be described in further detail in the following embodiments.

EXAMPLES

Example 1

In this example, an example that TFT is formed above a substrate having an insulating surface and a light-emitting element is further formed thereon is described with reference to FIG. 7. In this example, a cross-sectional view of certain TFT which is connected to a light-emitting element in a pixel portion is illustrated.

Then, abase insulating film 201 is formed by a lamination of insulating films such as a silicon oxide film, a silicon nitride film or a silicon oxide nitride film on a substrate 200. Although the base insulating film 201 herein uses a two-layer structure, it may use a structure having a single layer or two layers or more of the insulating films. The first layer of the base insulating film is a silicon oxide nitride film formed to have a thickness of 10 to 200 nm (preferably 50 to 100 nm) by a plasma CVD using a reaction gas of $SiH_4$, $NH_3$ and $N_2O$. Herein, a silicon oxide nitride film is formed (composition ratio: Si=32%, O=27%, N=24% and H=17%) having a film thickness of 50 nm. The second layer of the base insulating film is a silicon oxide nitride film deposited to have a thickness 50 to 200 nm (preferably 100 to 150 nm) by a plasma CVD using a reaction gas of $SiH_4$ and $N_2O$. Herein, a silicon oxide nitride film is formed (composition ratio: Si=32%, O=59%, N=7% and H=2%) having a film thickness of 100 nm.

Subsequently, a semiconductor layer is formed on the base film. The semiconductor layer is formed as follows: an amorphous semiconductor film is formed by known means (a sputtering, an LPCVD or a plasma CVD), then, the film is crystallized by a known crystallization method (a laser crystallization method, a thermal crystallization method or a thermal crystallization method using a catalyst such as nickel), and then, the crystalline semiconductor film is patterned into a desired form. This semiconductor layer is formed in a thickness of 25 to 80 nm (preferably 30 to 60 nm). The material of the crystalline semiconductor film, although not limited in material, is preferably formed of silicon or a silicon-germanium alloy.

In the case of making a crystalline semiconductor film by a laser crystallizing process, it is possible to use an excimer laser of a pulse-oscillation or continuous-oscillation type, a YAG laser or a $YVO_4$ laser. In the case of using such a laser, preferably used is a method that the laser light emitted from a laser oscillator is condensed by an optical system into a linear form to be irradiated onto the semiconductor film. The condition of crystallization is to be appropriately selected by those who implement the invention. In the case of using an excimer laser, pulse oscillation frequency is 30 Hz and laser energy density is 100 to 400 mJ/cm² (typically 200 to 300 mJ/cm²). Meanwhile, in the case of using a YAG laser, preferably its second harmonic is used and pulse oscillation frequency is 1 to 10 kHz and laser energy density is 300 to 600 mJ/cm² (typically 350 to 500 mJ/cm²). The laser light focused linear to a width of 100 to 1000 µm, e.g. 400 µm, is irradiated throughout the substrate entirety, whereupon the overlap ratio of linear laser beam may be taken 80 to 98%.

Then, the surface of the semiconductor layer is cleaned by an etchant containing a hydrogen fluoride, to form a gate insulating film 202 covering the semiconductor layer. The gate insulating film 202 is formed by an insulating film containing silicon having a thickness of 40 to 150 nm by the use of a plasma CVD or sputtering. In this example, a silicon oxide nitride film is formed (composition ratio: Si=32%, O=59%, N=7% and H=2%) to have a thickness of 115 nm by a plasma CVD. Of course, the gate insulating film is not limited to a silicon oxide nitride film but may be made in a single layer or a lamination of layers of insulating films containing other form of silicon.

After cleaning the surface of the gate insulating film 202, a gate electrode 210 or connection electrode is formed.

Then, a p-type providing impurity element (such as B), herein, adequate amounts of boron is added to the semiconductor to form a source region 211 and a drain region 212. After the addition, heating process, intense light radiation or laser irradiation is made in order to activate the impurity element. Simultaneously with activation, restoration is possible from the plasma damage to the gate insulating film or from the plasma damage at the interface between the gate insulating film and the semiconductor layer. Particularly, it is extremely effective to irradiate the second harmonic of a YAG laser at a main or back surface thereby activating the impurity element in an atmosphere at room temperature to 300° C. YAG laser is preferable activating means because of less maintenance.

In the subsequent process, after an interlayer insulating film 213a made from an organic or inorganic material is formed, and hydrogenation is carried out thereon, then, an insulator 213 made from photosensitive resin is formed, and then, an aluminum nitride, an aluminum oxynitride film shown as $AlN_xO_y$, or a first protection film 213b made from a silicon nitride film are formed. The film shown as $AlN_xO_y$ is formed by introducing oxygen, nitrogen, or rear gas from the gas inlet system by RF sputtering using a target made of AlN or Al. The content of nitrogen in the $AlN_xO_y$ film may be in the range of at least several atom %, or 2.5 to 47.5 atom %, and the content of oxygen may be in the range of at most 47.5 atom %, preferably, less than 0.01 to 20 atom %. A contact hole is formed therein reaching the source region or drain region. Next, a source electrode (line) 215 and a drain electrode 214 are formed to complete a TFT (p-channel TFT). This TFT will control the current that is supplied to EL element.

Also, the present invention is not limited to the TFT structure of this example but, if required, may be in a lightly doped drain (LDD) structure having an LDD region between the channel region and the drain region (or source region). This structure is provided with a region an impurity element is added with light concentration at between the channel formation region and the source or drain region formed by adding an impurity element with high concentration, which region is called an LDD region. Furthermore, it may be in, what is called, a GOLD (Gate-drain Overlapped LDD) structure arranging an LDD region overlapped with a gate electrode through a gate insulating film.

Meanwhile, although explanation herein was by using the p-channel TFT, it is needless to say that an n-channel TFT can be formed by using an n-type impurity element (P, As, etc.) in place of the p-type impurity element.

Also, although explanation herein was on a top-gate TFT, the invention is applicable regardless of the TFT structure, e.g. the invention is applicable to a bottom gate TFT (a reverse stagger TFT) or a forward stagger TFT.

Subsequently, in the pixel portion, a first electrode 217 in contact with a connecting electrode in contact with the drain region is arranged in matrix shape. This first electrode 217 serves as an anode or a cathode of the light-emitting element. Then, a insulator (generally referred to as a bank, a partition, a barrier, a mound, or the like) 216 that covers the end portion of the first electrode 217 is formed. For the insulator 216, a photosensitive organic resin is used. In the case of using a negative type photosensitive acrylic resin is used as a material of the insulator 216, for example, the insulator 216 may be preferably prepared such that the upper end portion of the insulator 216 has a curved surface having a first curvature radius and the lower end portion of the insulator has a curved surface having a second curvature radius. Each of the first and second curvature radiuses may be preferably in the range of 0.2 µm to 3 µm. Furthermore, a layer 218 containing an organic compound is formed on the pixel portion, and a second electrode 219 is then formed thereon to complete a light-emitting element. This second electrode 219 serves as a cathode or an anode of the light-emitting element.

The insulator 216 that covers the end portion of the first electrode 217 may be covered with a second protective film formed of an aluminum nitride film, an aluminum nitride oxide film, or a silicon nitride film.

Figure 7A:
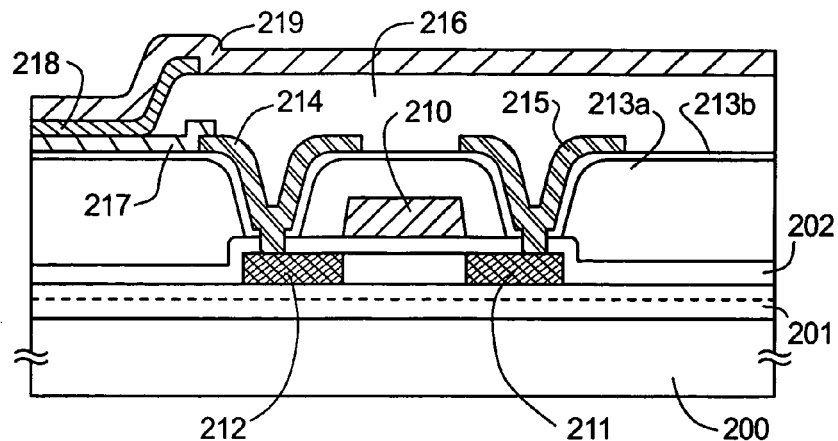
FIGS. 7A and 7B are sectional views showing sectional structures in a pixel portion.
Figure 7B:
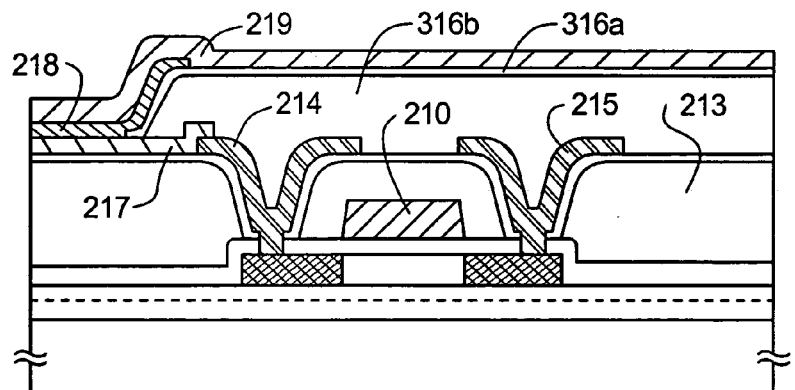

For instance, as shown in FIG. 7B, in the case of using a positive type photosensitive acrylic resin as a material of the insulator 316, only the upper end of the insulator 316b has a curved surface having a curvature radius. In this case, furthermore, the insulator 316b is covered with a protective film 316a formed of an aluminum nitride film, an aluminum nitride oxide film, or a silicon nitride film.

Depending on the direction of irradiating light, it is considered that there are two different structures of the active matrix type light-emitting device having TFT. One of them is a structure by which light emitted from the light-emitting element is irradiated into the eyes of the observer after passing through the second electrode. In this case, the observer is allowed to recognize an image on the second electrode side. The other of them is a structure by which light emitted from the light-emitting element is irradiated into the eyes of the observer after passing through the first electrode and the substrate.

For applying the structure by which light emitted from the light-emitting element is irradiated into the eyes of the observer after passing through the second electrode, it is preferable to use a material having a translucency as a material of the second electrode 219.

For instance, when the first electrode 217 is used as an anode, the material of the first electrode 217 may be a metal (i.e., Pt, Cr, W, Ni, Zn, Sn, or In) having a large work function. The end portion of such an electrode 217 is covered with the insulator (generally referred to as a bank, a partition, a barrier, a mound, or the like) 216, then, a vapor deposition is carried out moving an evaporation source along with the insulator (generally referred to as a bank, a partition, a barrier, a mound, or the like) 216 by using the film-forming device shown in Embodiment. For example, a film forming chamber is vacuum-exhausted until the degree of vacuum reaches $5 \times 10^{-3}$ Torr (0.665 Pa) or less, preferably $10^{-4}$ to $10^{-6}$ Pa, for vapor deposition. Prior to vapor deposition, the organic compound is vaporized by resistance heating. The vaporized organic compound is scattered on the substrate as the shutter is opened for vapor deposition. The vaporized organic compound is scattered upward, then, deposited on the substrate through an opening formed in a metal mask. Layers of the organic compound-containing layer are formed by vapor deposition so that the light-emitting element as a whole emits white light.

For instance, an $Alq_3$ film, an $Alq_3$ film partially doped with Nile red which is a red light emitting-pigment, an $Alq_3$ film, a p-EtTAZ film, and a TPD (aromatic diamine) film are layered in this order to obtain white light.

In case of using vapor deposition, a melting pot in which a vapor deposition material is stored in advance by a material maker is set in a film-forming chamber. Preferably, the melting pot is set in the film-forming chamber while avoiding contact with the air. A melting pot shipped from a material maker is preferably sealed in a second container during shipment and is introduced into a film-forming chamber in that state. Desirably, a chamber having vacuum exhaust means is connected to the film-forming chamber, the melting pot is taken out of the second container in vacuum or in an inert gas atmosphere in this chamber, and then the melting pot is set in the film-forming chamber. In this way, the melting pot and the EL material stored in the melting pot are protected from contamination.

The second electrode 219 comprises a laminate structure of a metal (e.g., Li, Mg, or Cs) having a small work function; and a transparent conductive film (made of an indium tin oxide (ITO) alloy, an indium zinc oxide alloy ($In_2O_3$—ZnO), zinc oxide (ZnO), or the like) on the thin film. For attaining a low-resistance cathode, an auxiliary electrode may be provided on the insulator 216. The light-emitting element thus obtained emits white luminescence. Here, the example in which the layer 218 containing the organic compound is formed by the application has been described. According to the present invention, however, it is not limited to a specific method and the layer 218 may be formed using a coating method (a spin coating method, an ink jet method).

In this example, as an organic compound layer, an example of laminating layers made from low molecular material is described though, lamination layers including a layer made from high molecular materials and a layer made from low molecular materials may be formed.

Furthermore, in the case of using the structure by which light emitted from the light emitting element is irradiated into the eyes of the observer after passing through the first electrode, it is preferable that the first electrode 217 may be prepared using a material having a translucency.

For instance, when the first electrode 217 is provided as an anode, a transparent conductive film (made of an indium tin oxide (ITO) alloy, an indium zinc oxide alloy ($In_2O_3$—ZnO), zinc oxide (ZnO), or the like) is used for a material of the first electrode 217 and the end portion thereof is covered with the insulator (generally referred to as a bank, a partition, a barrier, a mound, or the like) 216, followed by forming the layer 218 containing an organic compound. On this layer, furthermore, a second electrode 219 formed of a metal film (i.e., an alloy of MgAg, MgIn, AlLi, $CaF_2$, CaN, or the like, or a film formed by a co-vapor deposition of an element of Group I and Group II in the periodic table and aluminum) is formed as a cathode. Here, a resistive heating method using vapor deposition is used for the formation of a cathode, so that the cathode can be selectively formed using a vapor deposition mask. Further, the vapor deposition can be carried out by using the film-forming device shown at a cathode formation in Embodiment.

After forming the second electrode 219 and so on by the steps described above, a seal substrate is laminated using a sealing material to seal the light-emitting element formed on the substrate 200.

Figure 8A:
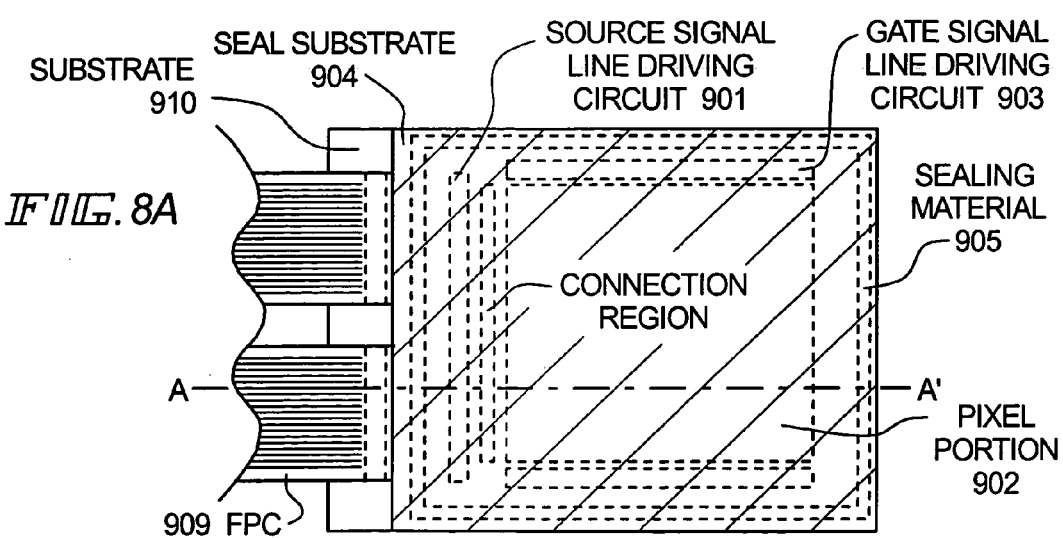
FIGS. 8A and 8B are an upper view and a sectional view of a light-emitting device.
Figure 8B:
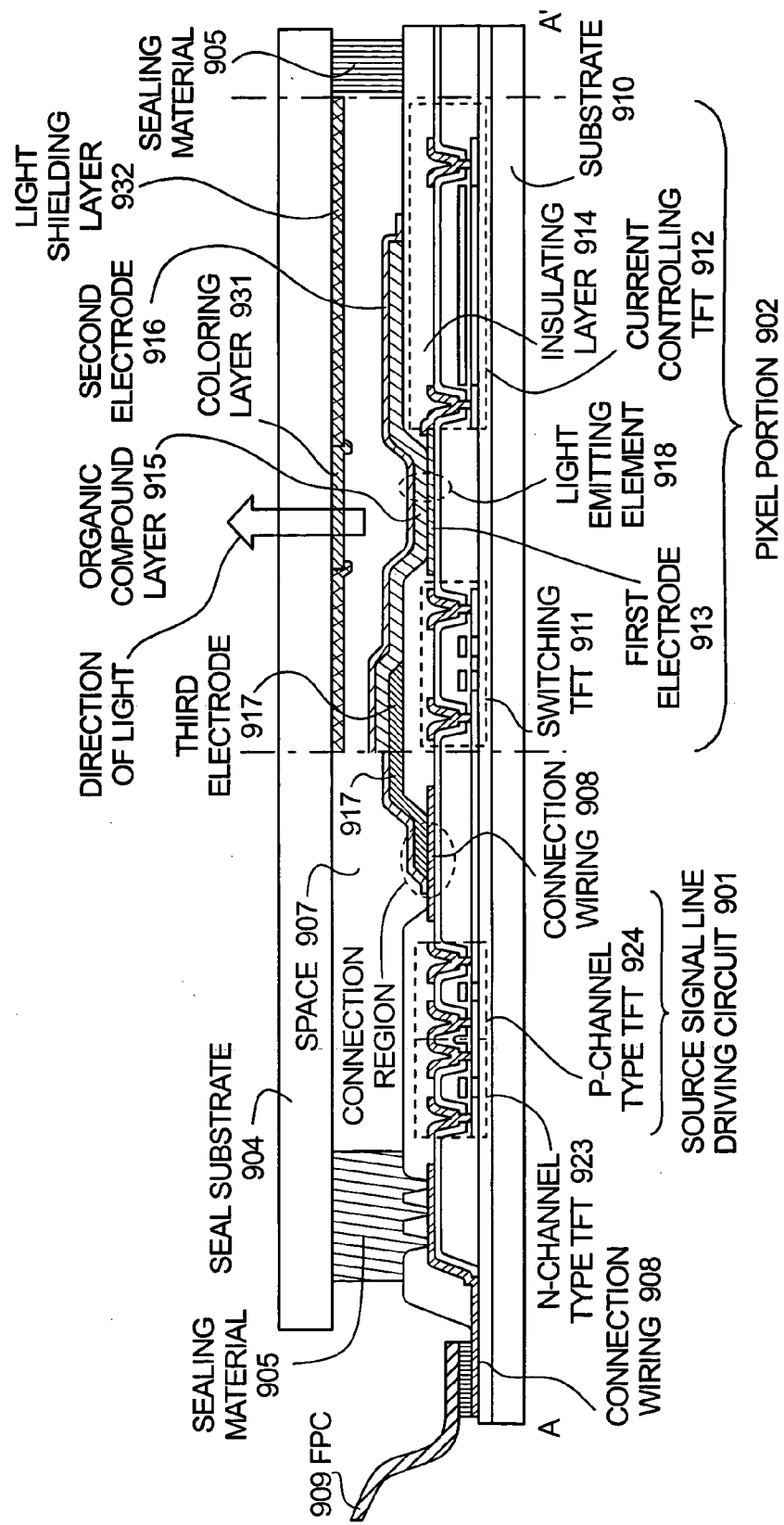

Further, an appearance view of an active matrix type light-emitting device is described with reference to FIG. 8. Further, FIG. 8A is a top view showing the light emitting apparatus and FIG. 8B is a sectional view constituted by cutting FIG. 8A by a line A–A'. Reference numeral 901 indicated by a dotted line designates a source signal line driving circuit, reference numeral 902 designates a pixel portion, and reference numeral 903 designates a gate signal line driving circuit. Further, reference numeral 904 designates a seal substrate, reference numeral 905 designates a sealing material and an inner side surrounded by the sealing material 905 constitutes a space 907.

Further, reference numeral 908 designates a wiring for transmitting signals inputted to the source signal line driving circuit 901 and the gate signal line driving circuit 903 for receiving a video signal or a clock signal from FPC (flexible printed circuit) 909 for constituting an external input terminal. Further, although only FPC is illustrated here, the FPC may be attached with a printed wiring board (PWB). The light emitting apparatus in the specification includes not only a main body of the light emitting apparatus but also a state in which FPC or PWB is attached thereto.

Next, a sectional structure will be explained in reference to FIG. 8B. Driver circuits and the pixel portion are formed over a substrate 910 and here, the source signal line driving circuit 901 as the driver circuit and the pixel portion 902 are shown.

Further, the source signal line driving circuit 901 is formed with a CMOS circuit combined with an n-channel type TFT 923 and a p-channel type TFT 924. Further, TFT for forming the driver circuit may be formed by a publicly-known CMOS circuit, PMOS circuit or NMOS circuit. Further, although according to the example, a driver integrated type formed with the driver circuits over the substrate is shown, the driver integrated type is not necessarily be needed and the driver circuits can be formed not over the substrate but at outside thereof.

Further, the pixel portion 902 is formed by a plurality of pixels each including a switching TFT 911, a current controlling TFT 912, and a first electrode (anode) 913 electrically connected to a drain of the current controlling TFT 912.

Further, an insulating layer 914 is formed at both ends of the first electrode (anode) 913 and an organic compound layer 915 is formed on the first electrode (anode) 913. The organic compound layer 915 is formed by moving an evaporation source along with the insulating film 914 by using the device shown in Embodiment. Further, a second electrode (cathode) 916 is formed over the organic compound layer 915. As a result, a light-emitting element 918 comprising the first electrode (anode) 912, the organic compound layer 915 and the second electrode (cathode) 916 is formed. Here, the light-emitting element 918 shows an example of white color luminescence and therefore, provided with the color filter comprising a coloring layer 931 and a light-shielding layer 932 (for simplification, overcoat layer is not illustrated here).

The second electrode (cathode) 916 functions also as a wiring common to all the pixels and electrically connected to FPC 909 via the connection wiring 908. The third electrode (auxiliary electrode) is formed on the insulating layer 914 to realize to make the second electrode have a low resistance.

Further, in order to seal the light-emitting element 918 formed over the substrate 910, the seal substrate 904 is pasted by the sealing material 905. Further, a spacer comprising a resin film may be provided for ensuring an interval between the seal substrate 904 and the light-emitting element 918. Further, the space 907 on the inner side of the sealing material 905 is filled with an inert gas of nitrogen or the like. Further, it is preferable to use epoxy species resin for the sealing material 905. Further, it is preferable that the sealing material 905 is a material for permeating moisture or oxygen as less as possible. Further, the inner portion of the space 907 may be included with the substance having an effect of absorbing oxygen of water.

Further, according to the example, as a material for constituting the seal substrate 904, other than glass substrate or quartz substrate, a plastic substrate comprising FRP (Fiberglass-Reinforced Plastics), PVF (polyvinyl fluoride), Mylar, polyester or acrylic resin can be used. Further, it is possible to adhere the seal substrate 904 by using the sealing material 905 and thereafter seal to cover a side face (exposed face) by a sealing material.

By sealing the light-emitting element in the space 907 as described above, the light-emitting element can completely be blocked from outside and a substance for expediting to deteriorate the organic compound layer such as moisture or oxygen can be prevented from invading from outside. Therefore, the highly reliable light-emitting device can be provided.

Further, this example can freely be combined with Embodiment.

Example 2

Figure 4:
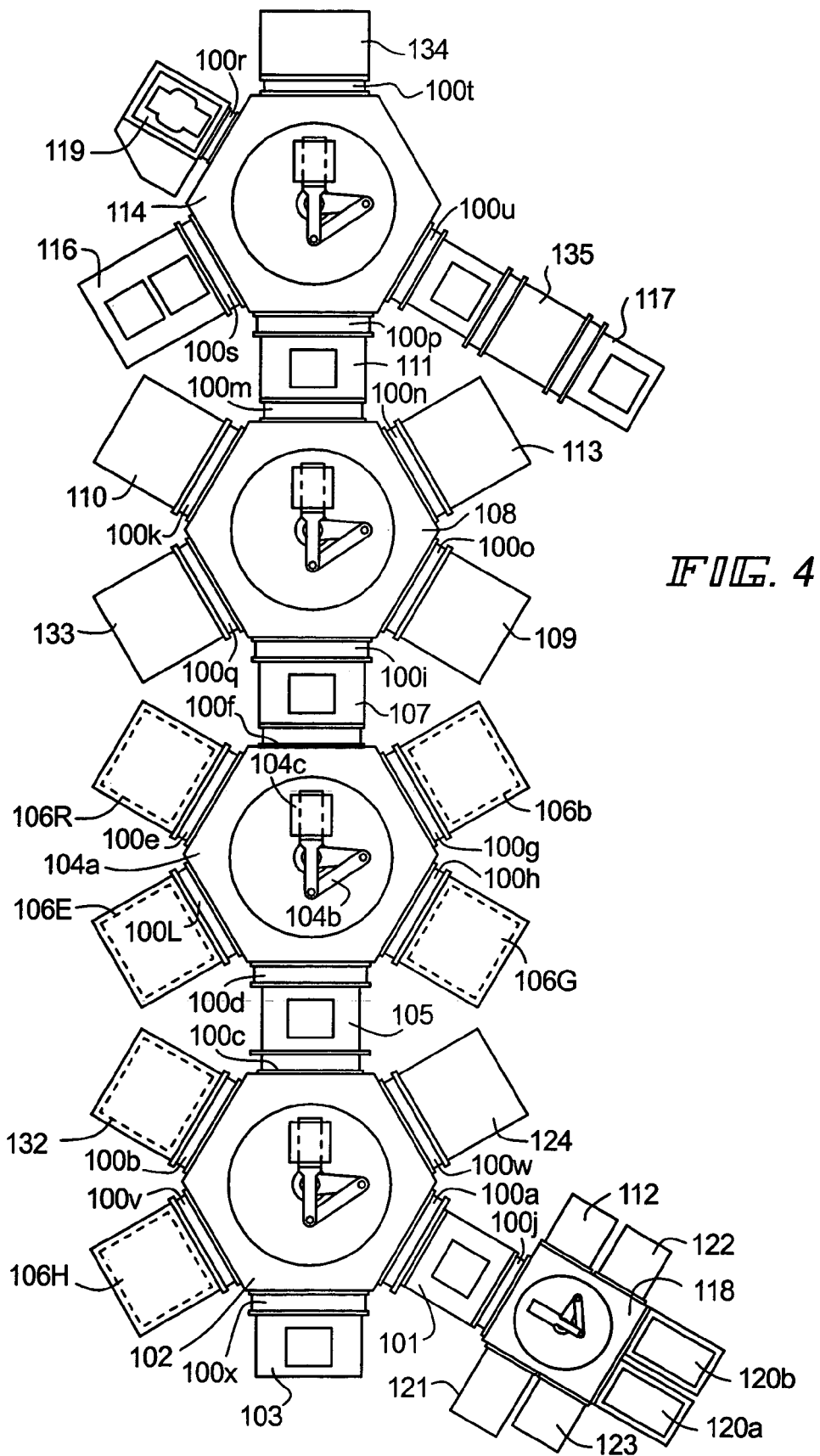
FIG. 4 is a diagram showing a manufacturing apparatus.

In this example, an example of a multi-chamber type manufacturing apparatus in which all operations from an operation of fabricating a first electrode to a sealing operation are automated is shown in FIG. 4.

FIG. 4 shows a multi-chamber manufacturing apparatus having gates 100a to 100x, a feeding chamber 101, a extraction chamber 119, convey chambers 102, 104a, 108, 114, and 118, transfer chambers 105, 107, and 111, film forming chambers 106R, 106B, 106G, 106H, 106E, 109, 110, 112, and 113, a pre-process chamber 103, a sealing substrate load chamber 117, a dispenser chamber 135, a sealing chamber 116, cassette chambers 120a and 120b, a tray set stage 121, a cleaning chamber 122, a baking chamber 123, and a mask stock chamber 124. A convey mechanism 104b for conveying a substrate 104c is arranged in the convey chamber 104a, and convey mechanisms are also arranged in other convey chambers, respectively.

A procedure which conveys a substrate on which an anode (first electrode) and an insulator (barrier) covering an end of the anode into the manufacturing apparatus shown in FIG. 4 to fabricate a light-emitting device will be described below. When an active matrix light-emitting device is fabricated, a plurality of thin film transistors (current control TFTs) and other thin film transistors (switching TFTs and the like) which are connected to the anode are formed, and a drive circuit constituted by the thin film transistors is also arranged. Also in fabrication of a simple matrix light-emitting device, it can be fabricated by the manufacturing apparatus shown in FIG. 4.

As a material of the anode (first electrode), a film containing, as a main component, an element selected from Ti, TiN, TiSi$_x$N$_y$, Ni, W, WSi$_x$, WN$_x$, WSi$_x$N$_y$, NbN, Mo, Cr, Pt, Zn, Sn, In, and Mo, an alloy material or a compound material containing one or more elements of these elements, or alaminate film obtained by laminating films of these above is used.

The substrate is set in the cassette chamber 120a or the cassette chamber 120b. When the substrate is a large substrate (for example, 300 mm×360 mm), the chamber is set in the cassette chamber 120b. When the chamber is a normal chamber (for example, 127 mm×127 mm), the substrate is conveyed onto the tray set stage 121. In this manner, a plurality of substrates are placed on the tray (for example 300 mm×360 mm).

Before the substrate is set in the cassette chamber, the surface of the first electrode (anode) is cleaned by a porous sponge (typically consisting of PVA (Polyvinyl alcohol), nylon, or the like) soaked with an interfacial active agent to reduce the number of point defects, so that dust is preferably removed from the surface. As a cleaning mechanism, a cleaning device having a roll brush (consisting of PVA) which is pivoted about an axis parallel to the surface of the substrate to be in contact with the surface of the substrate may be used, and a cleaning device having a disk brush (consisting of PVA) which is in contact with the surface of the substrate while being pivoted about an axis perpendicular to the surface of the substrate may be used. Before a film containing an organic compound is deposited, in order to remove water or other gases contained in the substrate, annealing for deaeration is preferably performed in a vacuum state. The substrate may be conveyed into the baking chamber 123 communicating with the convey chamber 118 to perform annealing.

A substrate on which a plurality of TFTs, an anode, and an insulator covering the ends of an anode are formed is conveyed into the convey chamber 118 and then conveyed into the cleaning chamber 122 to remove an impurity (dust such as fine particles) on the substrate surface with a solution. When cleaning is performed in the cleaning chamber 122, the substrate is set such that the film-formed surface of the substrate faces downward in the atmosphere. The substrate is conveyed into the baking chamber 123 to dry the substrate, and the substrate is heated to evaporate the solution.

The substrate is conveyed into the film forming chamber 112 for coating a film by spin coating, a poly (ethylene dioxy-tiofene)/poly (styrenesulfonate) aqueous solution (PEDOT/PSS) functioning as a hole injection layer is formed on the entire surface of the substrate on which the plurality of TFTs, an anode, and the insulator covering the ends of the anode are formed. A polyaniline/camphorated sulfonate aqueous solution (PANI/CSA), PTPDES, Et-PT-PDEK, PPBA, or the like may be coated on the entire surface and sintered. The film forming chamber 112 is a film forming chamber for forming an organic compound layer consisting of a polymer. When an organic compound layer is formed by spin coating in the film forming chamber 112, the substrate is set such that the film-formed surface of the substrate faces upward under the atmospheric pressure. When a hole injection layer consisting of a polymer material is formed by a coating method using spin coating or the like, flatness can be improved, and the coverage and the film thickness uniformity of the film formed on the hole injection layer can be made preferable. In particular, since the film thickness of a light-emitting layer is uniform, uniform light emission can be achieved. After film formation is performed by using water or an organic solution as a solvent, the substrate is conveyed into the baking chamber 123 to perform sintering and heated in a vacuum state to evaporate humidity.

The substrate is conveyed from the convey chamber 118 in which a substrate convey mechanism is arranged to the feeding chamber 101. In the manufacturing apparatus according to this embodiment, a robot installed in the convey chamber 118 can turn over the substrate, so that the substrate is turned over and conveyed into the feeding chamber 101. In this embodiment, the convey chamber 118 is always kept at an atmospheric pressure.

The feeding chamber 101 communicates with a vacuum evacuation process chamber. After the feeding chamber 101 is evacuated, an inert gas is preferably supplied into the feeding chamber 101 to set the pressure in the feeding chamber 101 at an atmospheric pressure.

The substrate is conveyed into the convey chamber 102. communicating with the feeding chamber 101. The convey chamber 102 is evacuated to be in a vacuum state such that water or oxygen is removed from the convey chamber 102 as much as possible.

The convey chamber 102 communicates with the vacuum evacuation process chamber which evacuate the convey chamber. As the vacuum evacuation process chamber, a magnetic floating type turbo molecular pump, a cryopump, or a dry pump is arranged. In this manner, the target degree of vacuum of the convey chamber can be made $10^{-5}$ to $10^{-6}$ Pa. Furthermore, back diffusion of an impurity from the pump and the discharge system can be controlled. In order to prevent an impurity from being supplied into the apparatus, an inert gas such as a nitrogen gas or a noble gas is used as a gas to be supplied. As the gas supplied into the apparatus, a gas which is purified by a gas purifier before the gas is supplied into the apparatus. Therefore, the gas purifier must be arranged to supply the gas into the film forming apparatus after the gas is purified. Therefore, oxygen, water, and other impurities contained in the gas can be removed in advance. For this reason, the impurity can be prevented from being supplied into the apparatus.

In order to eliminate shrinkage, vacuum heating is preferably performed immediately before a film containing an organic compound is deposited. The substrate is conveyed into a vacuum baking chamber 132, and, in order to remove water or other gases contained in the substrate, annealing for deaeration is performed in a vacuum state ($5 \times 10^{-3}$ Torr (0.665 Pa) or less, preferably, $10^{-4}$ to $10^{-6}$ Pa). In the vacuum baking chamber 132, a plurality of substrates can be uniformly heated by using a planar heater (typically, a sheath heater). A plurality of planar heaters can be arranged, and the substrates can be heated from both the sides such that the substrates are sandwiched by the planar heaters. As a matter of course, the substrates can also be heated from one side. In particular, when an organic resin film is used as a material of an interlayer insulating film or a barrier, some organic resin material easily absorbs water and may cause degasification. For this reason, before a layer containing an organic compound, the substrate is heated for, e.g., 30 minutes or more at a temperature of 100° C. to 250° C., preferably, 150° C. to 200° C., and vacuum heating which performs natural cooling for 30 minutes to remove absorbed water is effectively performed.

After the vacuum heating is performed, a substrate is conveyed from the convey chamber 102 to the transfer chamber 105, and the substrate is conveyed from the transfer chamber 105 to the convey chamber 104a without being in contact with the atmospheric air.

An organic compound layer serving as a light-emitting layer and consisting of low molecules is formed on a hole-injection layer (PEDOT) formed on the entire surface of the substrate. In this embodiment, the substrate is appropriately conveyed to film forming chambers 106R, 106G, 106B, 106H and 106E, and organic compound layers consisting of low molecules and serving as a hole transportation layer, a light-emitting layer, or an electron transportation layer are appropriately formed, and organic compound layers emitting white light, red light, green light, or blue light as a whole light emitting element, are formed. For example, when a light-emitting element for green light is formed, a hole transportation layer or a hole injection layer is laminated in the film forming chamber 106H, a light-emitting layer (G) is laminated in the film forming chamber 106G, and an electron transportation layer or an electron injection layer is laminated in the film forming chamber 106E. Thereafter, when a cathode is formed, a light-emitting layer for green light can be obtained. For example, when a full-color light-emitting element is formed, by using a deposition mask for R in the film forming chamber 106R, a hole transportation layer or a hole injection layer, a light-emitting layer (R), and an electron transportation layer or an electron injection layer are sequentially laminated. By using a deposition mask for G in the film forming chamber 106G, a hole transportation layer or a hole injection layer, a light-emitting layer (G), and an electron transportation layer or an electron injection layer are sequentially laminated. By using a deposition mask for B in the film forming chamber 106B, a hole transportation layer or a hole injection layer, a light-emitting layer (B), and an electron transportation layer or an electron injection layer are sequentially laminated, and a cathode is formed, so that a full-color light-emitting element can be obtained.

Organic compound layers which emit white light are classified into a three-band type organic compound layer containing three primary colors, i.e., red, green and blue and a two-band type organic compound layer using the relationship between complementary colors, i.e., blue/yellow or blue-green/orange when light-emitting layers having different emission colors are laminated. A white light-emitting element can also be formed in one film forming chamber.

If necessary, an electron transportation layer or an electron injection layer may be appropriately formed in the film forming chamber 106E, and a hole injection layer or a hole transportation layer may be formed in the film forming chamber 106H. When a deposition method is used, for example, deposition is performed in a film forming chamber which is evacuated to a degree of vacuum of $5 \times 10^{-3}$ Torr (0.665 Pa) or less, preferably, $10^{-4}$ to $10^{-6}$ Pa. In each film forming chamber, a mechanism for moving a deposition source as described in the embodiment as an example is arranged. A plurality of movable deposition source holders are prepared, and the deposition source holders appropriately have a plurality of vessels (crucibles) in which EL materials are sealed. The deposition holders in this state are arranged in the film forming chambers. A substrate is set in a face-down scheme, position alignment of a deposition mask is performed by a CCD or the like, and deposition is performed by a resistor heating method, so that film formation can be selectively performed.

In the deposition, an organic compound is vaporized by the resistor heating method in advance. In the deposition, the deposition source moves, and a shutter (not shown) or a substrate shutter (not shown) arranged in the deposition source is opened to scatter the organic compound onto the surface of the substrate. The evaporated organic compound is scattered above and deposited on the substrate through an opening (not shown) formed in a metal mask (not shown).

All the metal masks arranged in the film forming chambers can be stored in the mask stock chamber 124. When a mask is necessary in deposition, the mask is appropriately conveyed from the mask stock chamber 124 and set in a film forming chamber. Since the mask stock chamber is empty in deposition, a substrate on which a film is formed or a substrate which has been processed can also be stocked. A film forming chamber 133 is a spare film forming chamber for forming a layer containing an organic compound or a metal material layer.

In the film forming chamber, a crucible which stores a deposition material by a material manufacturer is preferably set in advance. The crucible is preferably set without being in contact with the atmospheric air. When the crucible is carried from the material manufacturer, the crucible is preferably supplied into a film forming chamber while the crucible is sealed in a second vessel. Desirably, a chamber (setting chamber for picking up or storing the crucible set in the second vessel which is airtightly sealed) communicating with the film forming chamber 106R and having a vacuum evacuating means is arranged. In this state, the crucible is picked out of the second vessel by a convey mechanism (not shown) in a vacuum atmosphere or an inert gas atmosphere, and the crucible is set in the deposition holder of the film forming chamber. In this manner, the crucible and the EL material stored in the crucible can be prevented from being contaminated.

When a film containing an organic compound and formed at an unwanted position must be removed, the substrate is conveyed into the pre-process chamber 103, and the laminated layers of the organic compound film may be selectively removed by using a metal mask. The pre-process chamber 103 has a plasma generation means, and excites gases of one or more types selected from Ar, $H_2$, F, $NF_3$, and $O_2$ to generate a plasma, thereby perform dry etching. Only an unnecessary portion can be selectively removed by using the mask. And the pre-process chamber 103 may comprise a UV irradiation mechanism such that ultraviolet irradiation can be performed as an anode surface process. In order to remove water or other gases contained in the substrate, a heating mechanism is arranged in the pre-process chamber 103 such that vacuum annealing for deaeration can be done.

After the substrate is conveyed from the convey chamber 104a to the transfer chamber 107, the substrate is conveyed from the transfer chamber 107 to the convey chamber 108 without being in contact with the atmospheric air.

The substrate is conveyed into the film forming chamber 110 by the convey mechanism arranged in the convey chamber 108, and a cathode (lower layer) constituted by a very thin metal film (film formed by a codeposition method using an alloy such as MgAg, MgIn, AlLi, or CaN or an element belonging to Group 1 or Group 2 of the periodic table) is formed by a resistor heating method. After the cathode (lower layer) constituted by the thin metal layer is formed, the substrate is conveyed into the film forming chamber 109 to form an electrode (upper layer) constituted by a transparent conductive film (ITO (Indium-Tin Oxide), an indium-oxide-zinc-oxide alloy ($In_2O_3$—ZnO), a zinc oxide (ZnO), or the like) is formed, and an electrode constituted by laminated layers constituted by a thin film metal layer and a transparent conductive film is appropriately formed.

A light-emitting element having a laminate structure shown in FIG. 7 is formed by the above steps.

The substrate is conveyed from the convey chamber 108 to the film forming chamber 113 without being in contact with the atmospheric air to form a protective film constituted by a silicon nitride film or a nitride-oxide silicon film. In this case, a sputter device having a target consisting of silicon, a target consisting of a silicon oxide, or a target consisting of a silicon nitride is arranged in the film forming chamber 113. For example, by using the target consisting of silicon, an atmosphere in the film forming chamber is set to be a nitrogen atmosphere or an atmosphere containing nitrogen and argon, so that a silicon nitride film can be formed.

A thin film (DLC film, CN film, or amorphous carbon film) containing carbon as a main component may be formed as a protective film, and a film forming chamber using a CVD method may be additionally arranged. A diamond-like carbon film (also called a DLC film) can be formed by a plasma CVD method (typically, an RF plasma CVD method, a microwave CVD method, an electron cyclotron resonance (ECR) CVD method, a hot-filament CVD method, or the like), a combustion flame method, a sputtering method, an ion-beam deposition method, a laser deposition method, or the like. A reaction gas used in the film formation is a hydrogen gas and a carbon-hydride-based gas (for example, $CH_4$, $C_2H_2$, $C_6H_6$, or the like). The reaction gas is ionized by glow discharge, and resultant ions are accelerated and impacted to a cathode which is negatively self-biased to form a film. A CN film may be formed by using a $C_2H_4$ gas and an $N_2$ gas as reaction gases. The DLC film and the CN film are insulating films which are transparent or translucent for visible light. The transparency with respect to the visible light means that a transmittance of the visible light ranges from 80 to 100%, and the translucence means that a transmittance of the visible light ranges 50 to 80%. For example, a thin film (DLC film, CN film, or amorphous carbon film) containing carbon as a main component may be formed as a protective film in a film forming chamber 134.

The substrate on which the light-emitting element is formed is conveyed from the convey chamber 108 to the transfer chamber 111 without being in contact with the atmospheric air, and the substrate is conveyed from the transfer chamber ill to the convey chamber 114.

The substrate on which the light-emitting element is formed is conveyed from the convey chamber 114 to the sealing chamber 116. In the sealing chamber 116, a sealing substrate on which a sealing material is formed is preferably prepared in advance.

The sealing substrate is externally set in the sealing substrate load chamber 117. Annealing, e.g., annealing in the sealing substrate load chamber 117 is preferably performed in advance in a vacuum state to remove an impurity such as water. When a sealing material is formed on the sealing substrate, the substrate is conveyed into the dispenser chamber 135, a sealing material to be stuck on the substrate on which the light-emitting element is formed is drawn, and the sealing substrate on which the sealing material is formed is conveyed into the sealing chamber 116. A drying agent may be set on the sealing substrate in the dispenser chamber 135.

In order to deaerate the substrate on which the light-emitting element is formed, after annealing is performed in a vacuum or inert atmosphere, the sealing substrate on which the sealing material is formed in the sealing chamber 116 is stuck on the substrate on which the light-emitting element is formed. An airtight space is filled with hydrogen, an inert gas, or a resin. In this case, the sealing material is formed on the sealed substrate. However, the present invention is not limited to this example, and a sealing material may be formed on the substrate on which the light-emitting element is formed.

UV light is irradiated on a pair of stuck substrates by an ultraviolet irradiation mechanism arranged in the sealing chamber 116 to cure the sealing material. In this case, an ultraviolet curing resin is used as the sealing material. However, any adhesive agent can also be used, and a thermoset resin or the like may be used.

The pair of stuck substrates are conveyed from the sealing chamber 116 to the convey chamber 114 and conveyed from the convey chamber 114 to a pickup chamber 119, and the substrates are picked up.

As described above, by using the manufacturing apparatus shown in FIG. 4, the substrate can be prevented from being exposed to the atmospheric air until the light-emitting element is sealed in an airtight space. For this reason, a reliable light-emitting device can be fabricated. In the convey chamber 114, although a vacuum state and a nitrogen atmosphere at the atmospheric pressure are alternately set, the convey chambers 102, 104a, and 108 are desirably set in vacuum states.

Although not shown here, a control device for controlling operations in the process chambers, a control device for conveying a substrate between the process chambers, a control device for controlling paths for moving a substrate to respective process chambers to realize automation, and the like are arranged.

An inline film forming apparatus can also be achieved.

A substrate is carried into the manufacturing apparatus shown in FIG. 4, and a transparent conductive film is used as an anode, so that a light-emitting element having a light-emitting direction which is opposite to the light-emitting direction of the laminate structure can also be formed. For example, a substrate on which a transparent conductive film is formed as an anode is carried into the apparatus, a layer containing an organic compound is formed, and a cathode constituted by a metal film (Al or Ag) is formed, so that a lower-side-emission type light-emitting element can also be formed. The lower-side-emission type light-emitting element means an element in which light generated by an organic compound layer is picked up from an anode serving as transparent electrode to a TFT and passed through a substrate. In the lower-side-emission type light-emitting element, an opaque substrate may be used as a sealing substrate, and a sealing can consisting of a metal material may be used.

A substrate on which a transparent conductive film is formed as an anode is carried, a layer containing an organic compound is formed, and a transparent or translucent electrode (e.g., a laminate layer constituted by a cathode consisting of a thin metal film (Al or Ag) and a transparent conductive film) is formed, so that a double-side-emission type light-emitting element can also be formed.

This embodiment can be freely combined with the embodiment and example 1.

Example 3

Figure 5A:
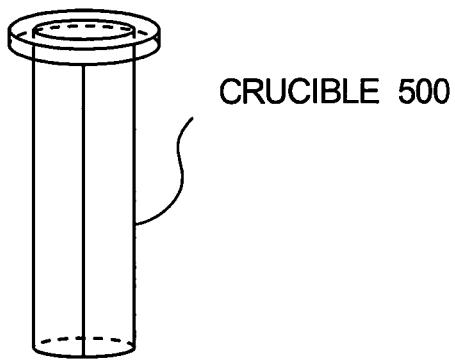
FIGS. 5A to 5C are diagrams showing the third embodiment.
Figure 5B:
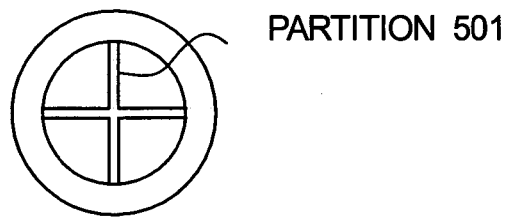
Figure 5C:
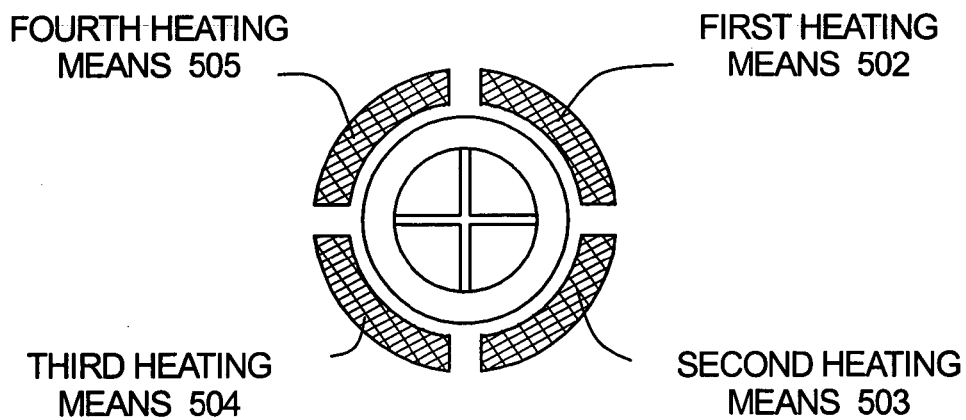
Figure 6A:
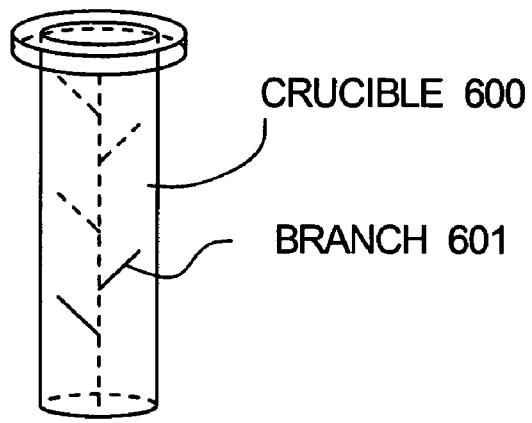
FIGS. 6A and 6B are diagrams showing the third embodiment.
Figure 6B:
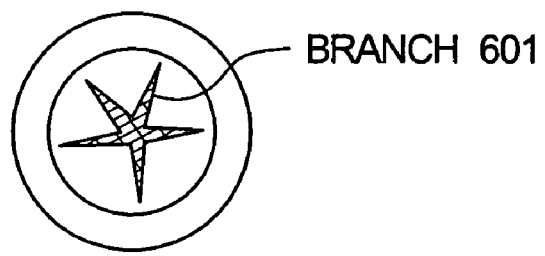
Figure 11A:
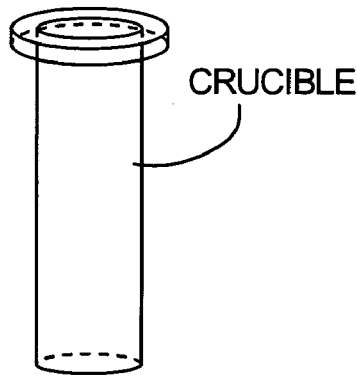
FIGS. 11A and 11B are diagrams showing a prior art.
Figure 11B:
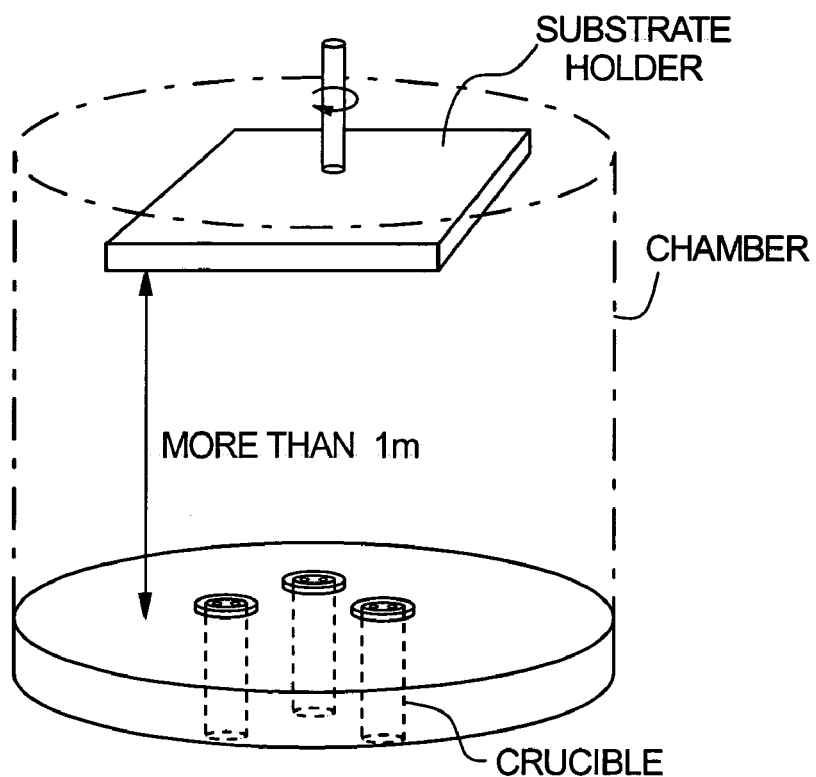

Here, an example of a crucible set in a deposition holder is shown in FIGS. 5 and 6. A conventional crucible is shown in FIG. 11A.

A crucible 500 shown in FIG. 5A, as shown in an upper view in corresponding FIG. 5B, the inside of the crucible is divided into four sections by a partition 501. In FIGS. 5A and 5B, although a shutter is not shown, four shutters are arranged in one crucible.

As described in the embodiment, when multitarget deposition is performed like code position by using an apparatus which moves a deposition source, a deposition source holder having crucibles arranged at large intervals cannot be easily applied to pixels having small sizes (intervals between insulators are small). Therefore, the crucible 500 shown in FIG. 5A is used, and heating means (first heating means 502, second heating means 503, third heating means 504, and fourth heating means 505) are arranged in the deposition source holder. A substrate is appropriately heated by the heating means, so that film formation can be performed at high accuracy. FIG. 5c is an upper view obtained when the heating means is set in the deposition source holder.

In this example, the inside of the crucible is divided into four sections. However, the number of sections is not limited to a specific number, and the inside of the crucible may be divided into two sections, three sections, or five or more sections.

When sublimation purification is directly performed to the crucible, as shown in FIG. 6, a crucible 600 having a branch (projection) 601 formed therein is preferably used. When the sublimation purification is directly performed to the crucible, an operation of transferring a deposition source from a vessel to the crucible or the like can be omitted. In addition, the deposition source is set in the deposition source holder while keeping the purity of the deposition source, so that a film containing an organic compound which rarely contains an impurity can be deposited. When a material having a high specific thermal conductivity is used as the material of the branch 601, time required for heating a deposition material can be shortened, and the deposition material in the crucible can be uniformly heated.

This example can be freely combined to the embodiment, example 1, or example 2.

Example 4

Various modules (active matrix liquid crystal module, and active matrix EC module) can be completed by using the driver circuit and the pixel portion that were formed by implementing the present invention. Thus, all of the electronic apparatus incorporated these modules into display portions can be completed.

Following can be given as such electronic apparatus: video cameras; digital cameras; head mounted displays (goggle type displays); car navigation systems; projectors; car stereos; personal computers; portable information terminals (mobile computers, mobile phones or electronic books etc.) etc. Examples of these are shown in FIGS. 9 and 10.

Figure 9A:
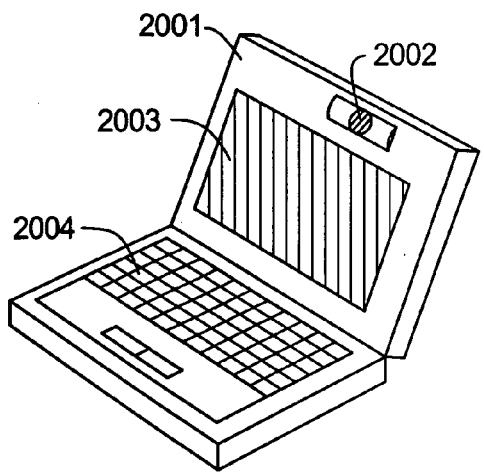
FIGS. 9A to 9F are diagrams showing an example of an electronic apparatus.

FIG. 9A is a personal computer which comprises: a main body 2001; an image input section 2002; a display section 2003; and a keyboard 2004 etc.

Figure 9B:
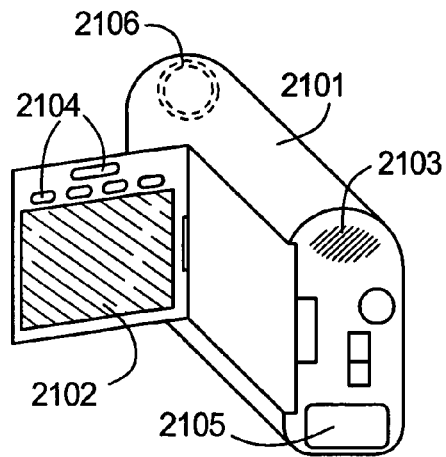

FIG. 9B is a video camera which comprises: a main body 2101; a display section 2102; an audio input section 2103; operation switches 2104; a battery 2105; and an image receiving section 2106.

Figure 9C:
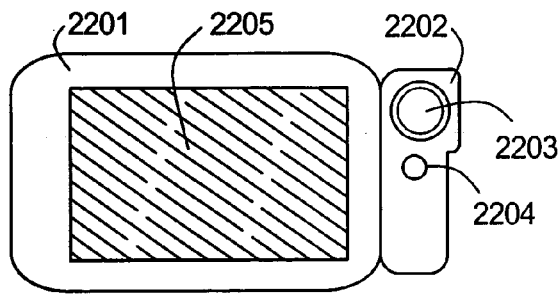

FIG. 9C is a mobile computer which comprises: a main body 2201; a camera section 2202; an image receiving section 2203; operation switches 2204 and a display section 2205 etc.

Figure 9D:
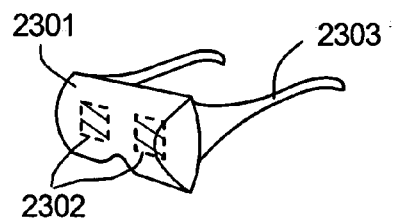

FIG. 9D is a head mounted display which comprises: a main body 2301; a display section 2302; and an arm section 2303.

Figure 9E:
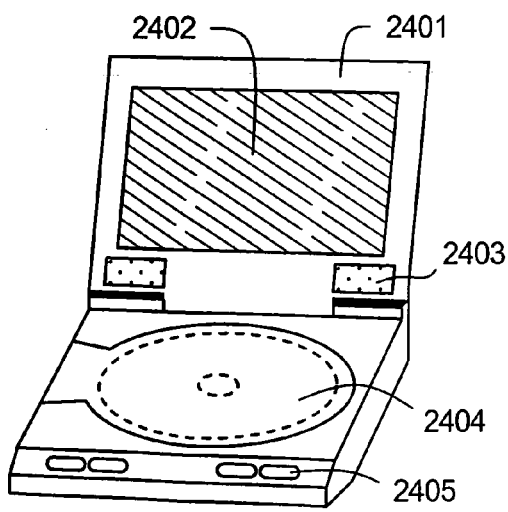

FIG. 9E is a player using a recording medium in which a program is recorded (hereinafter, a recording medium) which comprises: a main body 2401; a display section 2402; a speaker section 2403; a recording medium 2404; and operation switches 2405 etc. This apparatus uses DVD (digital versatile disc), CD, etc. for the recording medium, and can perform music appreciation, film appreciation, games and use for Internet.

Figure 9F:
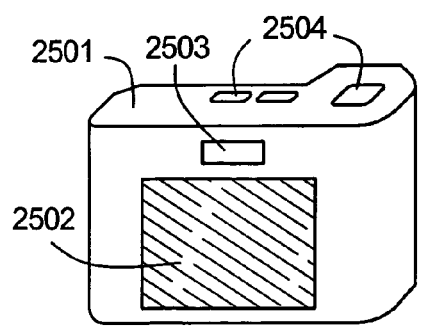

FIG. 9F is a digital camera which comprises: a main body 2501; a display section 2502; a view finder 2503; operation switches 2504; and an image receiving section not shown.

Figure 10A:
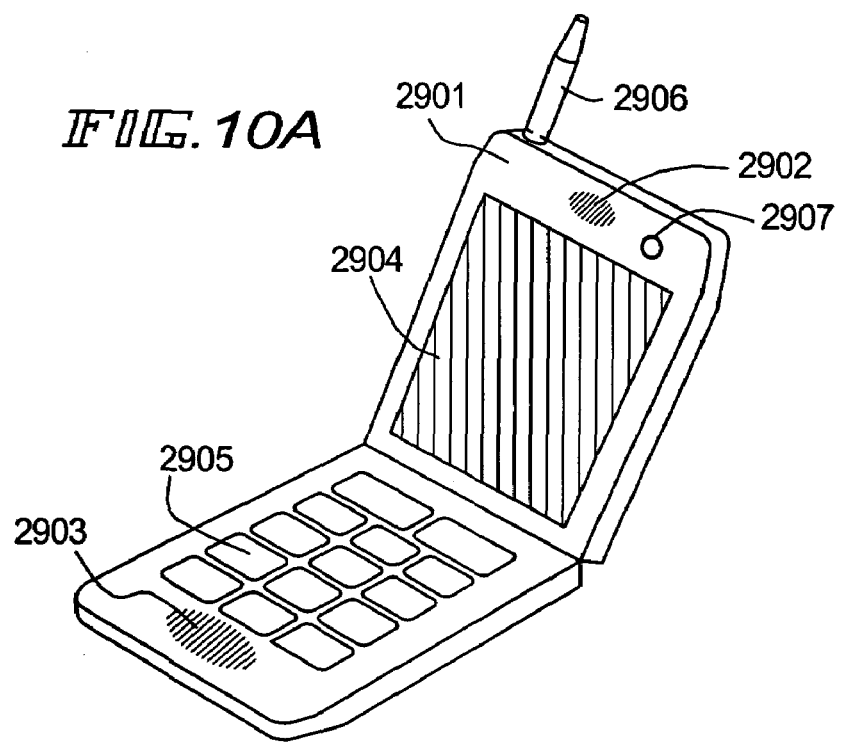
FIGS. 10A to 10C are diagrams showing an example of an electronic device.

FIG. 10A is a mobile telephone which comprises: a main body 2901; an audio output section 2902; an audio input section 2903; a display section 2904; operation switches 2905; an antenna 2906; and an image input section (CCD or image sensor) 2907.

Figure 10B:
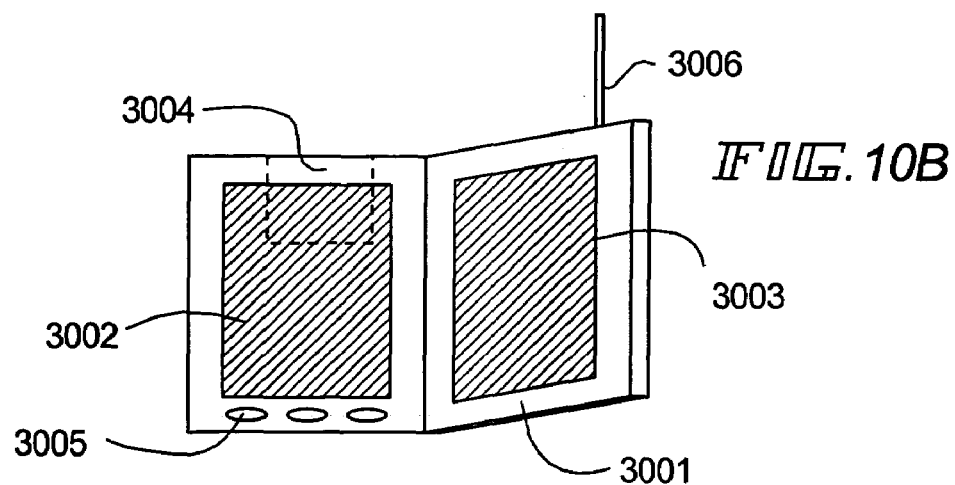

FIG. 10B is a portable book (electronic book) which comprises: a main body 3001; display sections 3002 and 3003; a recording medium 3004; operation switches 3005 and an antenna 3006 etc.

Figure 10C:
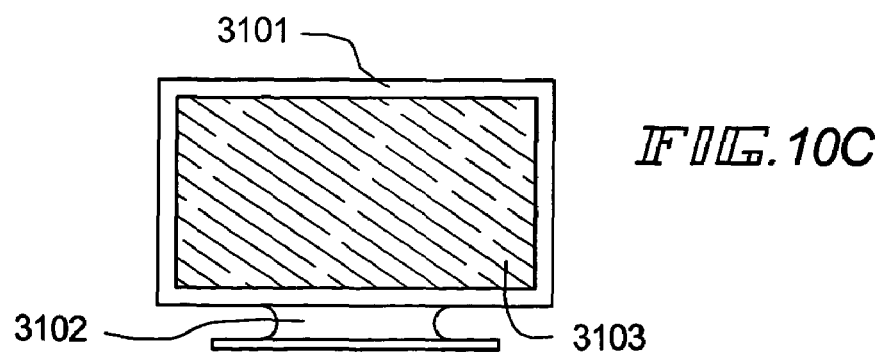

FIG. 10C is a display which comprises: a main body 3101; a supporting section 3102; and a display section 3103 etc. The present invention can complete the display section 3103 having a diagonal conjugate diameter of 10 to 50 inches.

As described above, the applicable range of the present invention is extremely large, and the invention can be applied to electronic apparatus of various areas. Note that the electronic apparatus of this example can be achieved by utilizing any combination of constitutions in Examples 1 to 3.

According to the present invention, the use efficiency of a deposition material, a throughput, and a film thickness distribution can be considerably improved. The present invention can cope with an increase in size of a deposition apparatus along with a further increase in size of a substrate in the future.

According to the present invention, a total amount of impurities existing in film forming chambers can be decreased, and impurities (water, oxygen, or the like) can be prevented from being mixed with a highly purified EL material. More specifically, the present invention can cope with further super high purification of a deposition material in the future.

What is claimed is:

1. A method of fabricating a light-emitting device comprising:
   evaporating a first material by heating in a chamber, said first material held by a deposition source;
   evaporating a second material by heating in the chamber concurrently with the evaporation of the first material, said second material held by the deposition source;
   depositing the evaporated first material and the evaporated second material over a substrate in the chamber; and
   changing a relative position of the deposition source with respect to the substrate along a straight line during the deposition of the first and second materials,
   wherein the heating of the first material is performed independently from the heating of the second material, and
   wherein at least one of the first material and second material comprises a light emitting material.

2. A method according to claim 1, wherein said deposition source is moved along a region partitioned by an insulator over said substrate.

3. A method according to claim 2, wherein the direction the deposition source moves and a longitudinal direction of the region partitioned by an insulator over said substrate are equal to each other.

4. A method according to claim 1, wherein, during the deposition, an interval distance between the deposition source and the substrate is not more than 30 cm.

5. A method according to claim 1, wherein the deposition source moves in an X direction or a Y direction.

6. A method according to claim 1, wherein a shutter which is opened and closed is arranged in the deposition source, and the shutter is opened in accordance with a region partitioned by an insulator during deposition.

7. A method according to claim 1, wherein a shutter, which is opened and closed, is arranged so that the shutter moves together with the deposition source.

8. A method according to claim 1, wherein said light-emitting device is incorporated into one selected from the group consisting of a personal computer, a video camera, a mobile computer, a head mounted display, a player using a recording medium, a digital camera, a mobile telephone, an electronic book, and a display.

9. A method of fabricating a light-emitting device comprising:
holding a first crucible and a second crucible by a deposition source;
evaporating a first material by heating in a chamber, said first material contained in the first crucible;
evaporating a second material by heating in the chamber concurrently with the evaporation of the first material, said second material contained in the second crucible wherein the second material is different from the first material;
depositing the evaporated first material and the evaporated second material over a substrate in the chamber; and
moving the deposition source together with the first and second crucibles relative to the substrate during the deposition of the first and second materials,
wherein at least one of the first material and the second material comprises a light emitting material.

10. A method of fabricating a light-emitting device comprising:
evaporating a first material by heating in a chamber, said first material held by a deposition source;
evaporating a second material by heating in the chamber concurrently with the evaporation of the first material, said second material held by the deposition source wherein the second material is different from the first material;
depositing the evaporated first material and the evaporated second material over a substrate in the chamber; and
changing a relative position of the deposition source with respect to the substrate along a straight line during the deposition of the first material and second material,
wherein the heating of the first material is performed independently from the heating of the second material and at least one of the first and second material comprises a light emitting material.

11. A method of fabricating alight-emitting device comprising:
evaporating a first material by heating in a chamber, said first material held by a deposition source;
evaporating a second material by heating in the chamber concurrently with the evaporation of the first material, said second material held by the deposition source;
depositing the evaporated first material and the evaporated second material over a substrate in the chamber; and
changing a relative position of the deposition source with respect to the substrate along a straight line during the deposition of the first material and second material,
wherein the heating of the first material is performed independently from the heating of the second material and at least one of the first and second material comprises a light emitting material, and
wherein the directions for deposition of said first material and said second material cross with each other.

12. A method of fabricating a light-emitting device comprising:
holding a first crucible and a second crucible by a deposition source;
evaporating a first material by heating in a chamber, said first material contained in the first crucible;
evaporating a second material by heating in the chamber concurrently with the evaporation of the first material, said second material contained in the second crucible wherein the second material is different from the first material;
depositing the evaporated first material and the evaporated second material over a substrate in the chamber; and
moving the deposition source together with the first and second crucibles relative to the substrate during the deposition of the first and second materials,
wherein the directions for deposition of said first material and said second material cross with each other, and
wherein at least one of the first material and the second material comprises a light emitting material.

13. A method of fabricating a light-emitting device according to claim 9, wherein said deposition source is moved along a region partitioned by an insulator over said substrate.

14. A method of fabricating a light-emitting device according to claim 10,
wherein said deposition source is moved along a region partitioned by an insulator over said substrate.

15. A method of fabricating a light-emitting device according to claim 11,
wherein said deposition source is moved along a region partitioned by an insulator over said substrate.

16. A method of fabricating a light-emitting device according to claim 12,
wherein said deposition source is moved along a region partitioned by an insulator over said substrate.

17. A method according to claim 9, wherein, during the deposition, an interval distance between the deposition source and the substrate is not more than 30 cm.

18. A method according to claim 10, wherein, during the deposition, an interval distance between the deposition source and the substrate is not more than 30 cm.

19. A method according to claim 11, wherein, during the deposition, an interval distance between the deposition source and the substrate is not more than 30 cm.

20. A method according to claim 12, wherein, during the deposition, an interval distance between the deposition source and the substrate is not more than 30 cm.

21. A method according to claim 9, wherein the deposition source moves in an X direction or a Y direction.

22. A method according to claim 16, wherein the deposition source moves in an X direction or a Y direction.

23. A method according to claim 11, wherein the deposition source moves in an X direction or a Y direction.

24. A method according to claim 12, wherein the deposition source moves in an X direction or a Y direction.

25. A method according to claim 9, wherein a shutter, which is opened and closed, is arranged so that the shutter moves together with the deposition source.

26. A method according to claim 10, wherein a shutter, which is opened and closed, so that the shutter moves together with the deposition source.

27. A method according to claim 11, wherein a shutter, which is opened and closed, so that the shutter moves together with the deposition source.

28. A method according to claim 12, wherein a shutter, which is opened and closed, is arranged so that the shutter moves together with the deposition source.

29. A method according to claim 9, wherein said light-emitting device is incorporated into one selected from the group consisting of a personal computer, a video camera, a mobile computer, a head mounted display, a player using a recording medium, a digital camera, a mobile telephone, an electronic book, and a display.

30. A method according to claim 10, wherein said light-emitting device is incorporated into one selected from the group consisting of a personal computer, a video camera, a mobile computer, a head mounted display, a player using a recording medium, a digital camera, a mobile telephone, an electronic book, and a display.

31. A method according to claim 11, wherein said light-emitting device is incorporated into one selected from the group consisting of a personal computer, a video camera, a mobile computer, a head mounted display, a player using a recording medium, a digital camera, a mobile telephone, an electronic book, and a display.

32. A method according to claim 12, wherein said light-emitting device is incorporated into one selected from the group consisting of a personal computer, a video camera, a mobile computer, a head mounted display, a player using a recording medium, a digital camera, a mobile telephone, an electronic book, and a display.

33. A method according to claim 9, further comprising changing the relative position of the deposition source with respect to the substrate along a second straight line different from said first line during the deposition of the first material and second material.

34. A method according to claim 10, further comprising changing the relative position of the deposition source with respect to the substrate along a second straight line different from said first line during the deposition of the first material and second material.

35. A method according to claim 11, further comprising changing the relative position of the deposition source with respect to the substrate along a second straight line different from said first line during the deposition of the first material and second material.

36. A method according to claim 12, further comprising changing the relative position of the deposition source with respect to the substrate along a second straight line different from said first line during the deposition of the first material and second material.

37. A method according to claim 9, wherein at least one of the first material and the second material comprises an organic compound.

38. A method according to claim 10, wherein at least one of the first material and the second material comprises an organic compound.

39. A method according to claim 11, wherein at least one of the first material and the second material comprises an organic compound.

40. A method according to claim 12, wherein at least one of the first material and the second material comprises an organic compound.

* * * * *